(12) United States Patent
Hatakeyama

(10) Patent No.: US 7,358,025 B2
(45) Date of Patent: *Apr. 15, 2008

(54) PHOTORESIST UNDERCOAT-FORMING MATERIAL AND PATTERNING PROCESS

(75) Inventor: Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 47 days.

This patent is subject to a terminal disclaimer.

(21) Appl. No.: 11/372,370

(22) Filed: Mar. 10, 2006

(65) Prior Publication Data

US 2006/0204891 A1    Sep. 14, 2006

(30) Foreign Application Priority Data

Mar. 11, 2005  (JP) .............................. 2005-069150

(51) Int. Cl.
*G03F 7/004* (2006.01)
*G03F 7/30* (2006.01)

(52) U.S. Cl. .................. 430/156; 430/270.1; 430/323; 430/326

(58) Field of Classification Search ................ 430/156, 430/270.1, 323, 326
See application file for complete search history.

(56) References Cited

U.S. PATENT DOCUMENTS

| | | | |
|---|---|---|---|
| 5,972,560 | A | 10/1999 | Kaneko et al. |
| 6,042,989 | A | 3/2000 | Schaedeli et al. |
| 6,420,088 | B1 | 7/2002 | Angelopoulos et al. |
| 6,506,497 | B1 | 1/2003 | Kennedy et al. |
| 6,537,719 | B1 * | 3/2003 | Takahashi .................. 430/191 |
| 6,623,909 | B2 | 9/2003 | Hatakeyama et al. |
| 6,730,453 | B2 | 5/2004 | Nakashima et al. |
| 6,852,791 | B2 | 2/2005 | Kawaguchi et al. |
| 2006/0019195 | A1 * | 1/2006 | Hatakeyama et al. .... 430/270.1 |

FOREIGN PATENT DOCUMENTS

| | | |
|---|---|---|
| JP | 6-118651 | 4/1994 |
| JP | 9-110938 | 4/1997 |
| JP | 10-324748 | 12/1998 |
| JP | 11-302382 | 11/1999 |
| JP | 2001-040293 | 2/2001 |
| JP | 2002-014474 | 1/2002 |
| JP | 2002-055456 | 2/2002 |
| JP | 2002-214777 | 7/2002 |
| JP | 2004-177666 | 6/2004 |

OTHER PUBLICATIONS

W. Brunsvold et al.; "Evaluation of Deep UV Bilayer Resist for Sub-Half Micron Litohography"; SPIE, vol. 1925, (1993) pp. 377-387.
J. Hatakeyama et al.; "Investigation of Discrimination Enhancement in Polysilsesquioxane Based Positive Resist for ArF Lithography"; SPIE, vol. 3333, (1998) pp. 62-72.
Ranee Kwong et al.; "IBM 193 nm Bilayer Resist: Materials, Lithographic Performance and Optimization"; SPIE, vol. 4345 (2001); pp. 50-57.
Tom Lynch et al.; "Properties and Performance of Near UV Reflectivity Control Layers"; SPIE, vol. 2195 (1994), pp. 225-229.
Ulrich Schaedeli et al.; "Evaluation of Materials for 193 -nm Lithography"; Journal of Photopolymer Science and Technology, vol. 9, No. 3 (1996) pp. 435-446.
J. M. Moran et al.; "High Resolution, Steep Profile Resist Patterns"; J. Vac. Sci. Technol. 16(6), Nov./Dec. 1979, pp. 1620-1624.

* cited by examiner

*Primary Examiner*—John S. Chu
(74) *Attorney, Agent, or Firm*—Westerman, Hattori, Daniels & Adrian, LLP.

(57) ABSTRACT

A material comprising a specific bisphenol compound with a group of many carbon atoms is useful in forming a photoresist undercoat. The undercoat-forming material, optionally combined with an intermediate layer having an antireflective effect, has an absorptivity coefficient sufficient to provide an antireflective effect at a thickness of at least 200 nm and a high etching resistance as demonstrated by slow etching rates with $CF_4/CHF_3$ and $Cl_2/BCl_3$ gases for substrate processing.

8 Claims, 6 Drawing Sheets

SUBSTRATE REFLECTANCE
UNDERCOAT LAYER n=1.0-2.0, VARYING k=0.3

SUBSTRATE REFLECTANCE
INTERMEDIATE LAYER n=1.5, VARYING k

INTERMEDIATE LAYER THICKNESS (nm)

□ 0-1  ▨ 1-2  ▨ 2-3  ▨ 3-4  ■ 4-5    SUBSTRATE REFLECTANCE (%)

SUBSTRATE REFLECTANCE
INTERMEDIATE LAYER n=1.5, k=0.1
UNDERCOAT LAYER n=1.5, k=0.2

UNDERCOAT LAYER THICKNESS (nm)

□ 0-1  ▨ 1-2  ▨ 2-3  ▨ 3-4  ■ 4-5    SUBSTRATE REFLECTANCE (%)

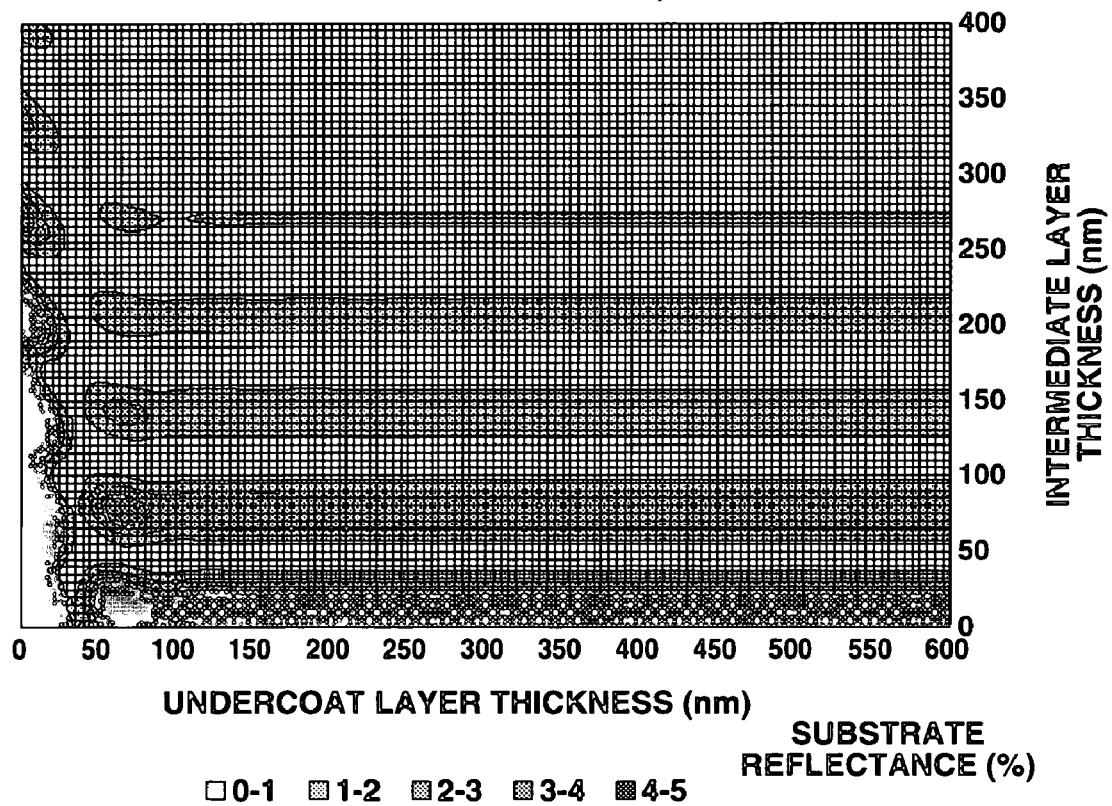

PHOTORESIST UNDERCOAT-FORMING MATERIAL AND PATTERNING PROCESS

CROSS-REFERENCE TO RELATED APPLICATION

This non-provisional application claims priority under 35 U.S.C. §119(a) on patent application No. 2005-069150 filed in Japan on Mar. 11, 2005, the entire contents of which are hereby incorporated by reference.

TECHNICAL FIELD

This invention relates to an undercoat-forming material useful in a multilayer resist technology for micropatterning in a process for the fabrication of semiconductor devices or the like, and a resist pattern-forming process adapted for exposure to KrF excimer laser (248 nm), ArF excimer laser (193 nm), $F_2$ laser (157 nm), $Kr_2$ laser (146 nm), $Ar_2$ laser (126 nm) beams, soft X-rays, electron beams, ion beams and X-rays, using the same.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 μm or less), a shorter wavelength light source is required. In particular, photolithography using ArF excimer laser light (193 nm) is now under investigation.

On the other hand, it is known in the art that the bilayer resist process is advantageous in forming a high-aspect ratio pattern on a stepped substrate. In order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF excimer laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). For ArF excimer laser exposure, positive resist compositions comprising as a base a silsesquioxane of the type in which cyclohexylcarboxylic acid has substituted thereon an acid labile group were proposed (see JP-A 10-324748, JP-A 11-302382, and SPIE vol. 3333 (1998), p. 62). For $F_2$ laser exposure, positive resist compositions based on a silsesquioxane having hexafluoroisopropanol as a dissolvable group were proposed (see JP-A 2002-55456). The above polymer bears in its backbone a polysilsesquioxane containing a ladder skeleton produced through polycondensation of a trialkoxysilane or trihalosilane.

Silicon-containing (meth)acrylate polymers were proposed as a resist base polymer having silicon pendants on side chains (see JP-A 9-110938, J. Photopolymer Sci. and Technol., Vol. 9, No. 3 (1996), pp. 435-446).

The undercoat layer of the bilayer resist process is formed of a hydrocarbon compound which can be etched with oxygen gas, and must have high etching resistance since it serves as a mask when the underlying substrate is subsequently etched. For oxygen gas etching, the undercoat layer must be formed solely of a silicon atom-free hydrocarbon. To improve the line-width controllability of the upper layer of silicon-containing resist and to minimize the sidewall corrugation and pattern collapse by standing waves, the undercoat layer must also have the function of an antireflective coating. Specifically, the reflectance from the undercoat layer back into the resist film must be reduced to below 1%.

Now, the results of calculation of reflectance at film thickness varying up to the maximum of 500 nm are shown in FIGS. 1 and 2. Assume that the exposure wavelength is 193 nm, and the topcoat resist has an n value of 1.74 and a k value of 0.02. FIG. 1 shows substrate reflectance when the undercoat layer has a fixed k value of 0.3, the n value varies from 1.0 to 2.0 on the ordinate and the film thickness varies from 0 to 500 nm on the abscissa. Assuming that the undercoat layer of the bilayer resist process has a thickness of 300 nm or greater, optimum values at which the reflectance is reduced to or below 1% exist in the refractive index range of 1.6 to 1.9 which is approximate to or slightly higher than that of the topcoat resist.

FIG. 2 shows substrate reflectance when the undercoat layer has a fixed n value of 1.5 and the k value varies from 0 to 1.0. In the k value range of 0.24 to 0.15, the reflectance can be reduced to or below 1%. By contrast, the antireflective film used in the form of a thin film of about 40 nm thick in the monolayer resist process has an optimum k value in the range of 0.4 to 0.5, which differs from the optimum k value of the undercoat layer used with a thickness of 300 nm or greater in the bilayer resist process. For the undercoat layer in the bilayer resist process, an undercoat layer having a lower k value, that is, more transparent is necessary.

As the material for forming an undercoat layer in 193 nm lithography, copolymers of polyhydroxystyrene with acrylates are under study as described in SPIE vol. 4345, p. 50 (2001). Polyhydroxystyrene has a very strong absorption at 193 nm and its k value is as high as around 0.6 by itself. By copolymerizing with an acrylate having a k value of almost 0, the k value of the copolymer is adjusted to around 0.25.

However, the resistance of the acrylic polymer to substrate etching is weak as compared with polyhydroxystyrene, and a considerable proportion of the acrylate must be copolymerized in order to reduce the k value. As a result, the resistance to substrate etching is considerably reduced. The etching resistance is not only reflected by the etching speed, but also evidenced by the development of surface roughness after etching. Through copolymerization of acrylic compound, the surface roughness after etching is increased to a level of serious concern.

Naphthalene ring is one of rings that have a more transparency at 193 nm and a higher etching resistance than benzene ring. JP-A 2002-14474 proposes an undercoat layer having a naphthalene or anthracene ring. However, since naphthol-copolycondensed novolac resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolac resin and polyvinyl naphthalene resin have low n values at 193 nm, as evidenced by a value of 1.4 for the naphthol-copolycondensed novolac resin and a value of only 1.2 for the polyvinyl naphthalene resin when the inventors measured. JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

Also proposed was a tri-layer process of stacking a silicon-free monolayer resist as a topcoat, an intermediate layer containing silicon below the resist, and an organic undercoat below the intermediate layer. See J. Vac. Sci. Technol., 16(6), November/December 1979. Since the monolayer resist generally provides better resolution than the silicon-containing resist, the tri-layer process permits such a high resolution monolayer resist to be used as an imaging layer for light exposure. A spin-on-glass (SOG) coating is used as the intermediate layer. A number of SOG coatings have been proposed.

In the tri-layer process, the optimum optical constants of the undercoat layer for controlling reflection from the substrate are different from those in the bilayer process. The purpose of minimizing substrate reflection, specifically to a level of 1% or less is the same between the bi- and tri-layer processes. In the bilayer process, only the undercoat layer is endowed with the antireflective effect. In the tri-layer process, either one or both of the intermediate layer and the undercoat layer may be endowed with the antireflective effect.

U.S. Pat. Nos. 6,506,497 and 6,420,088 disclose silicon-containing layer materials endowed with antireflective effect. In general, a multi-layer antireflective coating has greater antireflective effect than a monolayer antireflective coating and commercially widely used as an antireflective film for optical articles. A higher antireflective effect is obtainable by imparting an antireflective effect to both an intermediate layer and an undercoat layer. If the silicon-containing intermediate layer in the tri-layer process is endowed with the function of an antireflective coating, the undercoat layer need not necessarily possess the maximum function of an antireflective coating. In the tri-layer process, the undercoat layer is required to have high etching resistance during substrate processing rather than the antireflective coating effect. Then a novolac resin having high etching resistance and containing more aromatic groups must be used as the undercoat layer in the tri-layer process.

FIG. 3 illustrates substrate reflectance with a change of the k value of the intermediate layer. It is seen that by setting a k value as low as 0.2 or less and an appropriate thickness to the intermediate layer, a satisfactory antireflective effect as demonstrated by a substrate reflectance of up to 1% is achievable. In general, the antireflective coating must have a k value of 0.2 or greater in order to reduce reflectance to or below 1% at a coating thickness of 100 nm or less (see FIG. 2). In the tri-layer structure wherein the undercoat layer serves to restrain reflection to a certain extent, the intermediate layer may have an optimum k value of less than 0.2.

FIGS. 4 and 5 illustrate changes of reflectance with the varying thickness of the intermediate layer and undercoat layer, when the undercoat layer has a k value of 0.2 and 0.6, respectively. The undercoat layer having a k value of 0.2 assumedly corresponds to the undercoat layer optimized for the bilayer process, and the k value of 0.6 for the undercoat layer is approximate to the k values at 193 nm of novolac and polyhydroxystyrene. The thickness of the undercoat layer varies with the topography of the substrate whereas the thickness of the intermediate layer is kept substantially unchanged so that presumably it can be coated to the predetermined thickness. The undercoat layer with a higher k value (0.6) is effective in reducing reflectance to 1% or less with a thinner film. In the event where the undercoat layer has a k value of 0.2 and a thickness of 250 nm, the intermediate layer must be increased in thickness in order to provide a reflectance of 1% or less. Increasing the thickness of the intermediate layer is not preferable because a greater load is applied to the topcoat of resist during dry etching of the intermediate layer. To use the undercoat layer in thin film form, it must have not only a high k value, but also greater etching resistance.

In the event the underlying processable film is a low dielectric constant insulating film of porous silica, the positive resist suffers from a footing problem and a poisoning problem that scum is left in the spaces. It is believed that these problems arise because ammonia is adsorbed by the porous silica during the substrate cleaning step using ammonia and then liberated during the resist processing step to neutralize the acid generated in the exposed area of resist. JP-A 2004-177666 proposes to use a polymer having acidic groups for prohibiting the poisoning problem.

SUMMARY OF THE INVENTION

An object of the present invention is to provide an undercoat-forming material comprising a specific bisphenol compound with a group of many carbon atoms which material is useful as an undercoat layer in the bi- or tri-layer resist technology and has greater etching resistance than polyhydroxystyrene and cresol novolac resins, and a pattern-forming process using the same.

The inventor has discovered that a specific bisphenol compound with a group of many carbon atoms is a promising material to form an undercoat layer for the bi- or tri-layer resist technology and has improved etching resistance.

More particularly, the invention relates to a material for forming an undercoat layer in the bi- or tri-layer resist technology, comprising a specific bisphenol compound with a group of many carbon atoms or a novolac resin obtained through condensation thereof as a base resin, which material has improved etching resistance and is adapted for exposure to high-energy radiation of less than 300 nm wavelength, specifically excimer lasers at 248, 193 and 157 nm, soft x-rays of 3 to 20 nm, electron beams and x-rays. The material is fully resistant to dry etching during substrate processing.

The undercoat layer of the invention is primarily applicable to the tri-layer process. The undercoat layer provides substantial substrate reflection when used in the bilayer process using KrF or ArF, due to a high k value for that use, but when combined with an intermediate layer having an antireflective effect, can reduce the substrate reflectance to 1% or less.

Additionally, the undercoat-forming material of the invention forms a film which is densified enough to provide a barrier effect to ammonia gas, prohibiting the poisoning problem.

Accordingly, the present invention provides an undercoat-forming material and a pattern-forming process as defined below.

In one aspect, the invention provides a photoresist undercoat-forming material comprising a bisphenol compound having the general formula (1) and a photoresist undercoat-forming material comprising a resin comprising recurring units derived by novolac formation of a bisphenol compound, as represented by the general formula (2).

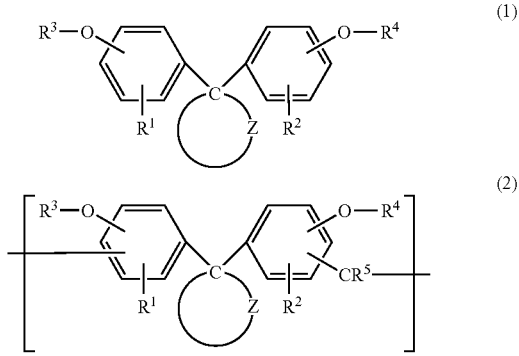

Herein $R^1$ and $R^2$ are each independently hydrogen, a straight, branched or cyclic $C_1$-$C_{10}$ alkyl group, $C_6$-$C_{10}$ aryl group or $C_2$-$C_{10}$ alkenyl group. $R^3$ and $R^4$ are each independently hydrogen, a straight, branched or cyclic $C_1$-$C_6$ alkyl group, straight, branched or cyclic $C_2$-$C_6$ alkenyl group, $C_6$-$C_{10}$ aryl group, $C_2$-$C_6$ acetal group, $C_2$-$C_6$ acyl group or glycidyl group. Z is a divalent $C_{13}$-$C_{30}$ hydrocarbon group containing an aromatic skeleton or fused polycyclic hydrocarbon group, which may contain at least one hetero atom. $R^5$ is hydrogen, a straight, branched or cyclic $C_1$-$C_{10}$ alkyl group or $C_6$-$C_{10}$ aryl group.

The material may further comprise an organic solvent, a crosslinker and an acid generator.

In another aspect, the invention provides a patterning process comprising the steps of applying the undercoat-forming material defined above onto a processable substrate to form an undercoat layer, applying a photoresist composition onto the undercoat layer to form a photoresist layer, exposing the photoresist layer in a predetermined region to radiation, developing the photoresist layer with a developer to form a photoresist pattern, and processing the undercoat layer and the substrate through the patterned photoresist layer as a mask, by means of a dry etching apparatus. In a preferred embodiment, the photoresist composition comprises a silicon atom-containing polymer, and the processing step includes dry etching the undercoat layer through the photoresist layer as a mask with an oxygen-based etching gas.

In a further aspect, the invention provides a patterning process comprising the steps of applying the undercoat-forming material defined above onto a processable substrate to form an undercoat layer, applying a silicon atom-containing intermediate layer over the undercoat layer, applying a photoresist composition onto the intermediate layer to form a photoresist layer, exposing the photoresist layer in a predetermined region to radiation, developing the photoresist layer with a developer to form a photoresist pattern, processing the intermediate layer through the patterned photoresist layer as a mask, removing the patterned photoresist layer, and processing the undercoat layer and then the substrate through the processed intermediate layer as a mask, the processing steps using a dry etching apparatus. In a preferred embodiment, the photoresist composition comprises a silicon atom-free polymer, and the step of processing the undercoat layer includes dry etching with an oxygen-based etching gas.

BENEFITS OF THE INVENTION

The photoresist undercoat-forming material of the invention, optionally combined with an intermediate layer having an antireflective effect, has an absorptivity coefficient sufficient to provide an antireflective effect at a thickness equal to or more than 200 nm and a high etching resistance as demonstrated by an etching rate with $CF_4/CHF_3$ gas and $Cl_2/BCl_3$ gas (used in substrate processing) which is slower than conventional m-cresol novolac resins. The resist profile after patterning is satisfactory.

BRIEF DESCRIPTION OF THE DRAWINGS

FIG. 5 is a graph plotting the substrate reflectance versus varying thickness of the undercoat layer and intermediate layer in trilayer process when the undercoat layer has a fixed n of 1.5 and a fixed k of 0.6, and the intermediate layer has a fixed n of 1.5 and a fixed k of 0.1.

DESCRIPTION OF THE PREFERRED EMBODIMENTS

Figure 1:
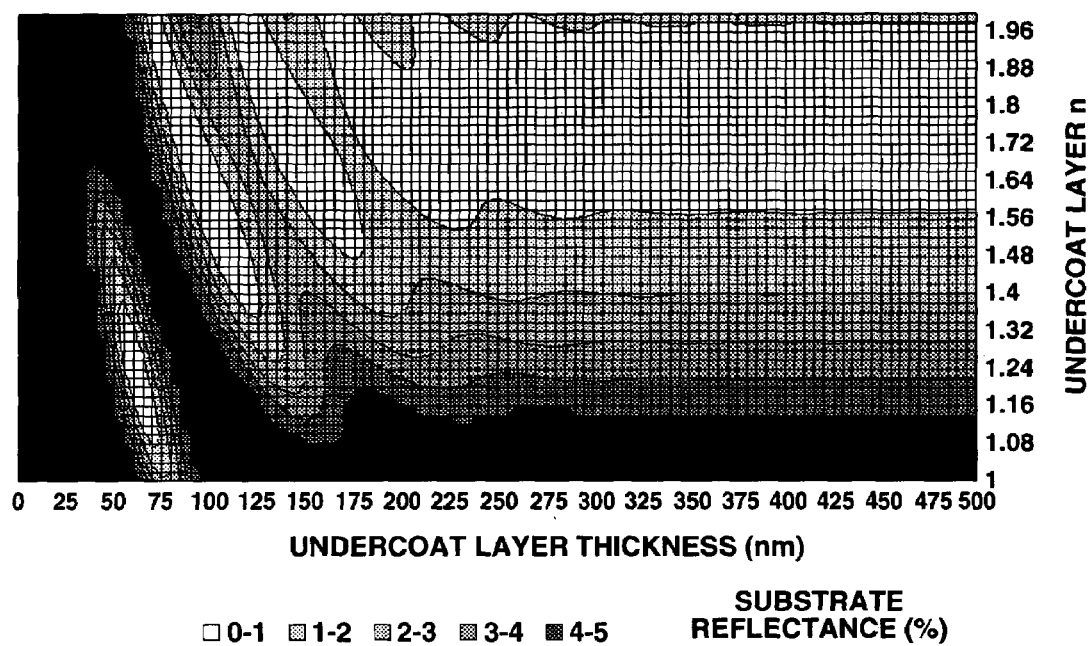
FIG. 1 is a graph plotting the substrate reflectance versus undercoat layer thickness in bilayer process when the k value of the undercoat layer is fixed at 0.3 and the n value varies from 1.0 to 2.0.
Figure 2:
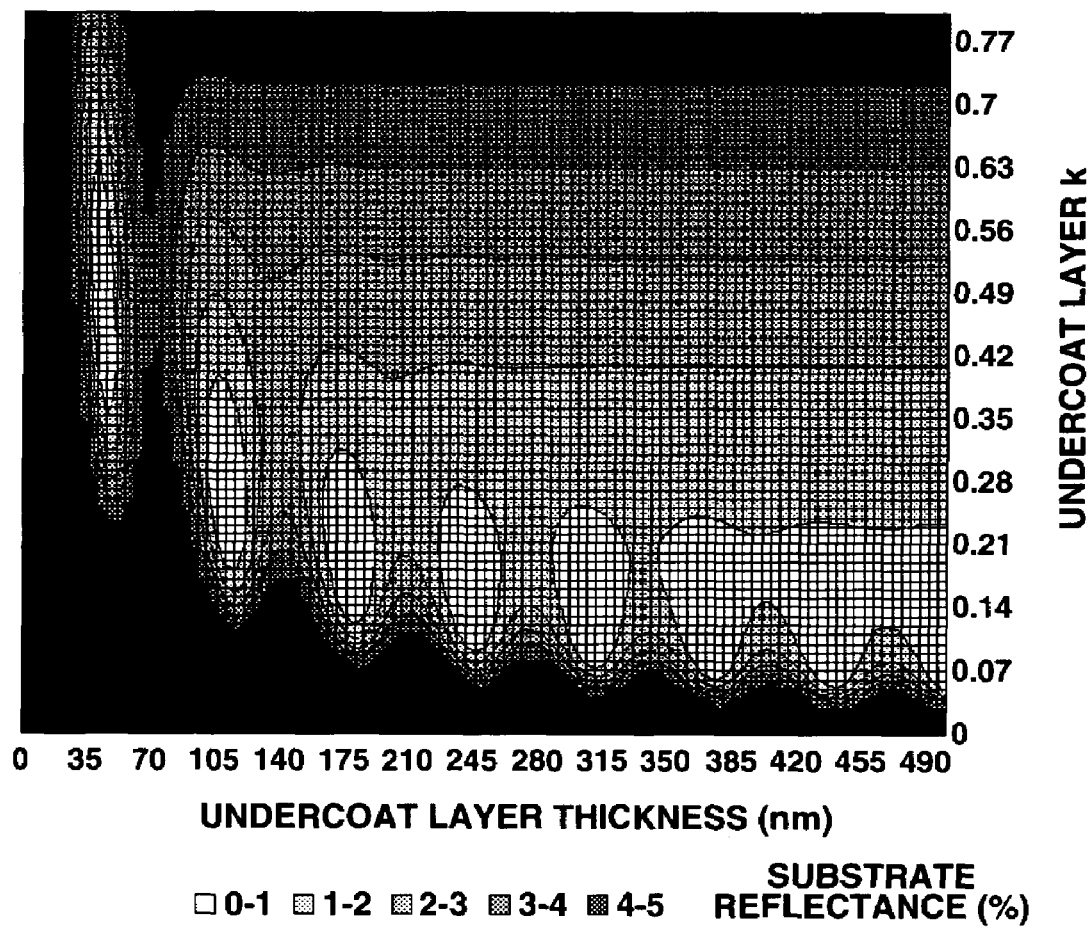
FIG. 2 is a graph plotting the substrate reflectance versus undercoat layer thickness in bilayer process when the n value of the undercoat layer is fixed at 1.5 and the k value varies from 0 to 1.0.
Figure 3:
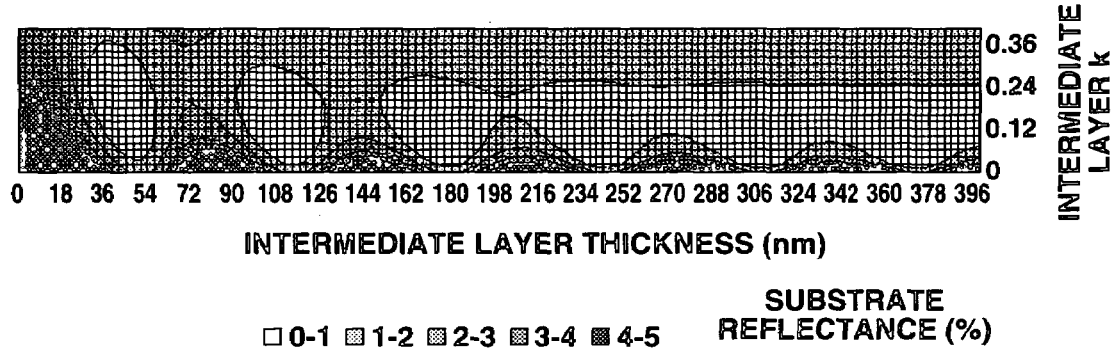
FIG. 3 is a graph plotting the substrate reflectance in trilayer process when the undercoat layer has a fixed n of 1.5, a fixed k of 0.6 and a fixed thickness of 500 nm, and the intermediate layer has a fixed n of 1.5, a k value varying from 0 to 0.4 and a thickness varying from 0 to 400 nm.
Figure 4:
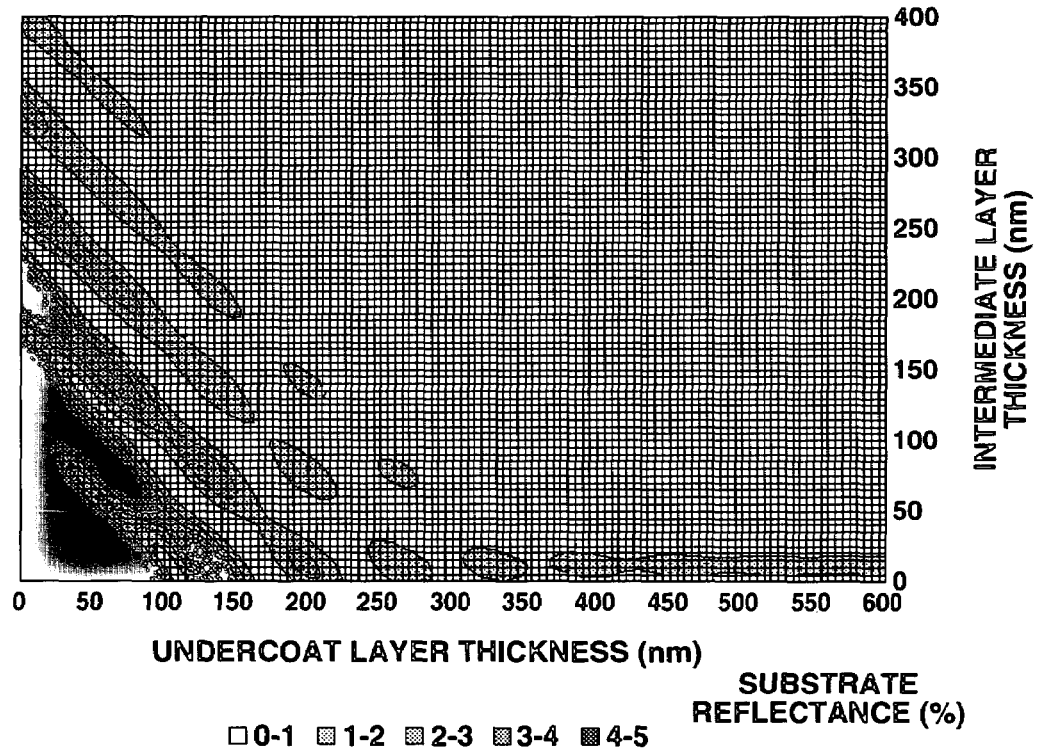
FIG. 4 is a graph plotting the substrate reflectance versus varying thickness of the undercoat layer and intermediate layer in trilayer process when the undercoat layer has a fixed n of 1.5 and a fixed k of 0.2, and the intermediate layer has a fixed n of 1.5 and a fixed k of 0.1.

The notation (Cn-Cm) means a group containing from n to m carbon atoms per group.

The patterning process of the invention involves the steps of applying a photoresist undercoat-forming material comprising a specific bisphenol compound with a group of many carbon atoms as represented by the general formula (1) or a resin comprising recurring units derived by novolac formation of a bisphenol compound as represented by the general formula (2) as a base resin onto a substrate to form an undercoat layer, applying a layer of a photoresist composition over the undercoat layer, optionally with an intermediate layer interposed therebetween, exposing the photoresist layer in a predetermined region to radiation, developing the photoresist layer with a liquid developer to form a resist pattern, and processing the undercoat layer and the substrate through the patterned photoresist layer as a mask, by means of a dry etching apparatus. The undercoat-forming material used herein comprises essentially (A) a specific bisphenol compound with a group of many carbon atoms as represented by the general formula (1) and/or a resin comprising recurring units derived by novolac formation of a bisphenol compound as represented by the general formula (2), and optionally and preferably (B) an organic solvent. For improving the spin coating characteristics, burying of stepped substrates and film's rigidity and solvent resistance, the undercoat-forming material may further comprise (C) a blending polymer, (D) a crosslinker, and (E) an acid generator.

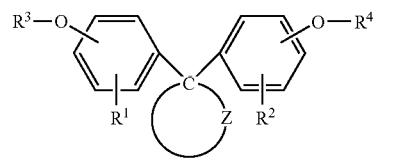 (1)

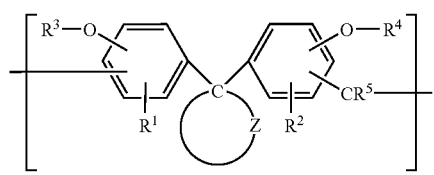 (2)

Herein $R^1$ and $R^2$ are each independently hydrogen, a straight, branched or cyclic $C_1$-$C_{10}$ alkyl group, $C_6$-$C_{10}$ aryl group or $C_2$-$C_{10}$ alkenyl group. $R^3$ and $R^4$ are each independently hydrogen, a straight, branched or cyclic $C_1$-$C_6$ alkyl group, straight, branched or cyclic $C_2$-$C_6$ alkenyl group, $C_6$-$C_{10}$ aryl group, $C_2$-$C_6$ acetal group, $C_2$-$C_6$ acyl group or glycidyl group. Z is a divalent $C_{13}$-$C_{30}$ hydrocarbon group containing an aromatic skeleton or fused polycyclic hydrocarbon group, which may contain at least one hetero atom. $R^5$ is hydrogen, a straight, branched or cyclic $C_1$-$C_{10}$ alkyl group or $C_6$-$C_{10}$ aryl group.

Illustrative examples of $R^1$ and $R^2$ include a hydrogen atom, alkyl groups such as methyl, ethyl, propyl, isopropyl, butyl, isobutyl, tert-butyl, pentyl, cyclopentyl, hexyl, cyclohexyl, and octyl, aryl groups such as phenyl, tolyl and xylyl, and alkenyl groups such as vinyl, allyl, propenyl, butenyl, hexenyl and cyclohexenyl. Illustrative examples of $R^3$ and $R^4$ include a hydrogen atom, alkyl, alkenyl and aryl groups as exemplified above, acetal groups such as ethoxyethyl, methoxymethyl, ethoxypropyl, ethoxybutyl, propoxyethyl and butoxyethyl, acyl groups such as acetyl, and glycidyl. Illustrative examples of $R^5$ include a hydrogen atom, alkyl and aryl groups as exemplified above.

Examples of the linking moiety of the formula:

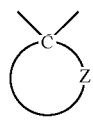

are illustrated below.

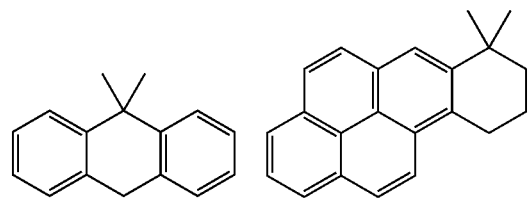

-continued

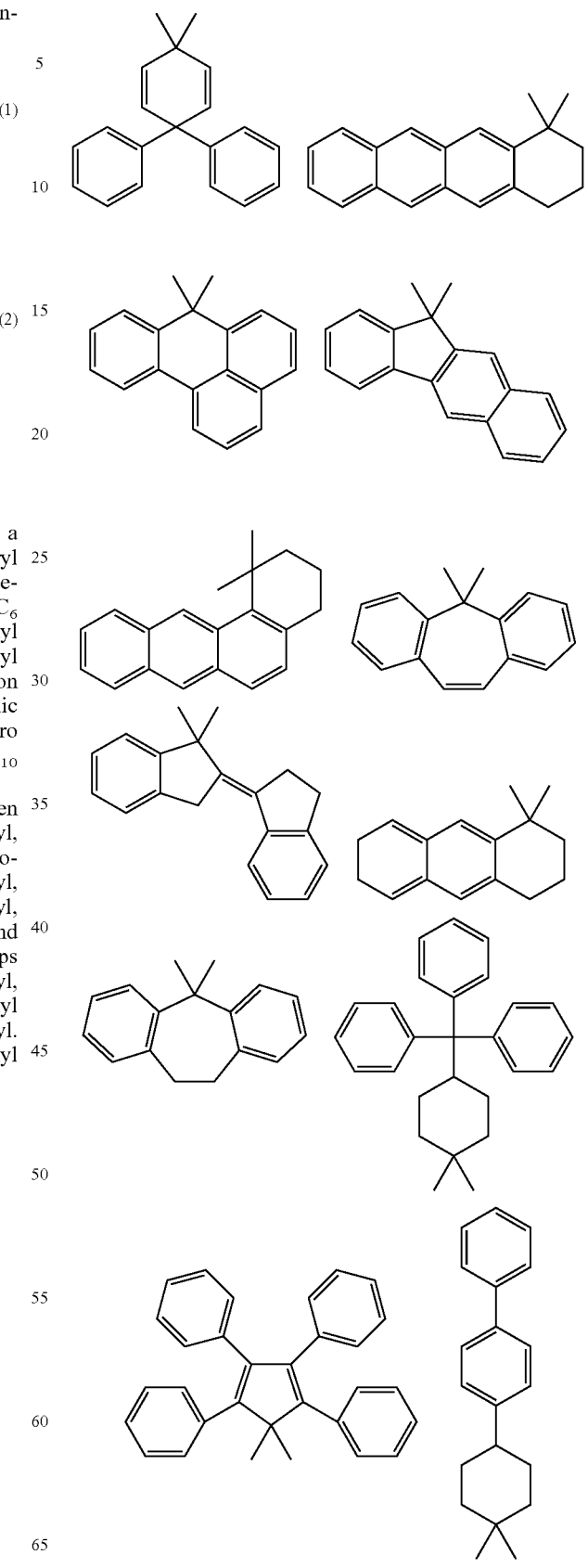

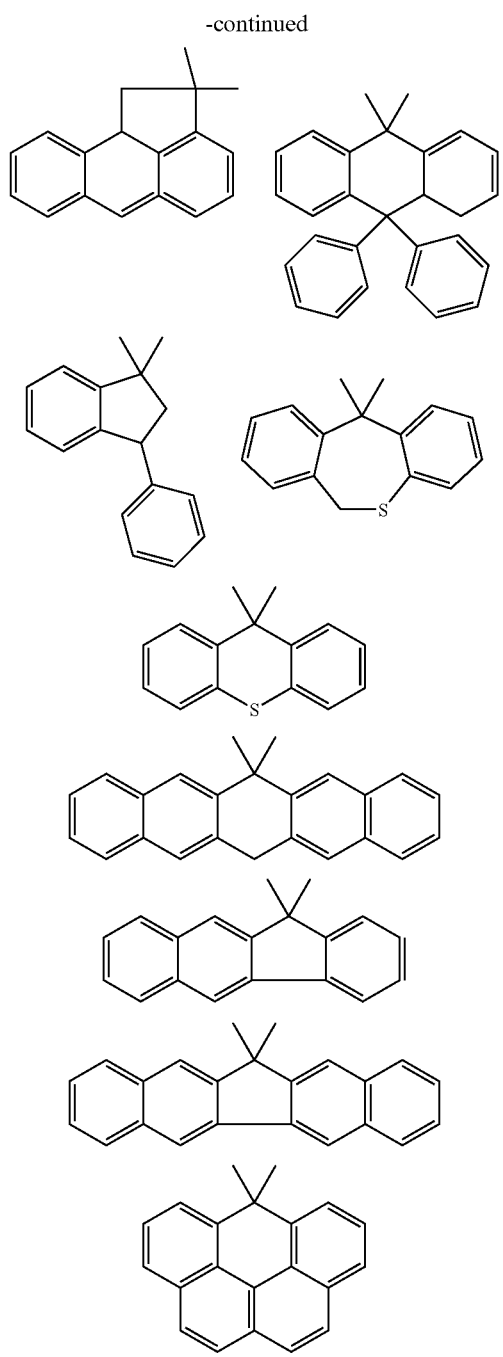
Illustrative, non-limiting examples of the compound having formula (1) are shown below.
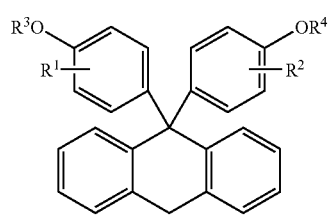
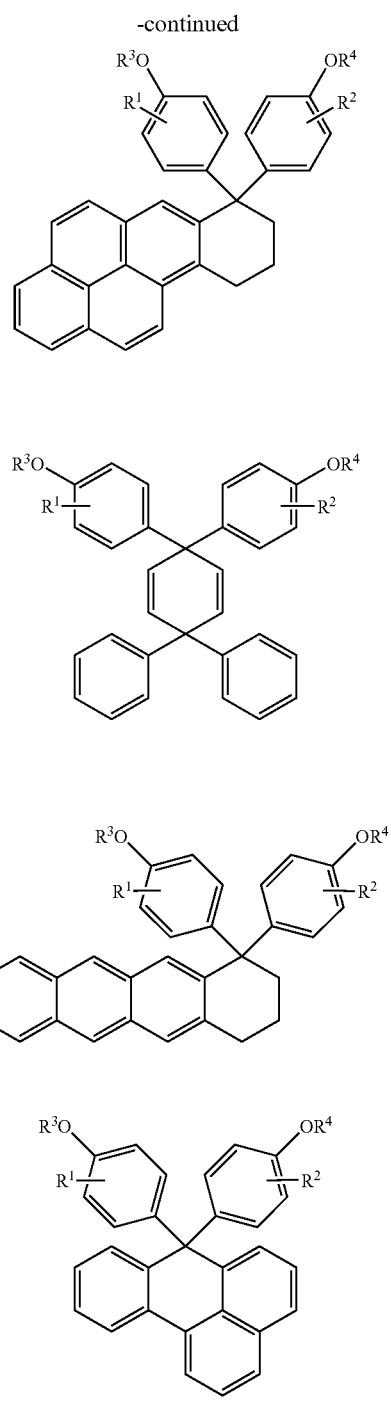
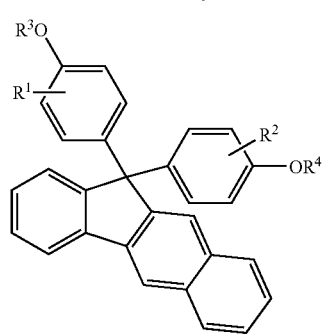

-continued
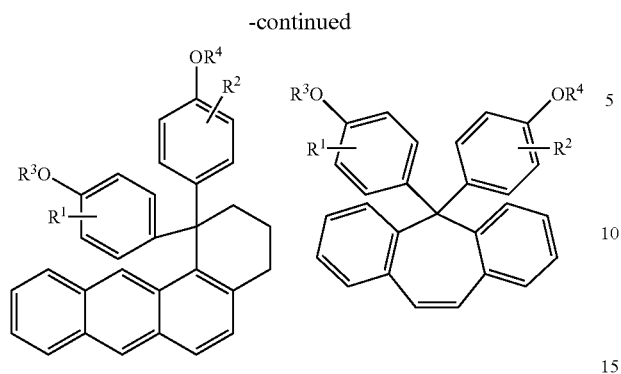
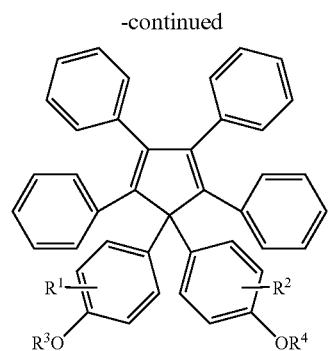
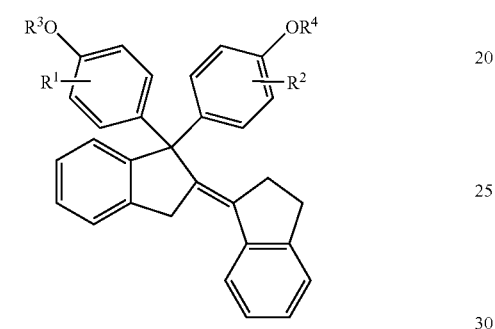
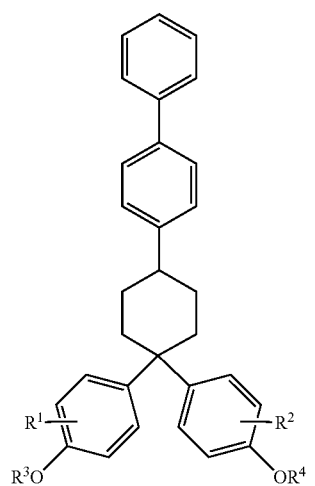
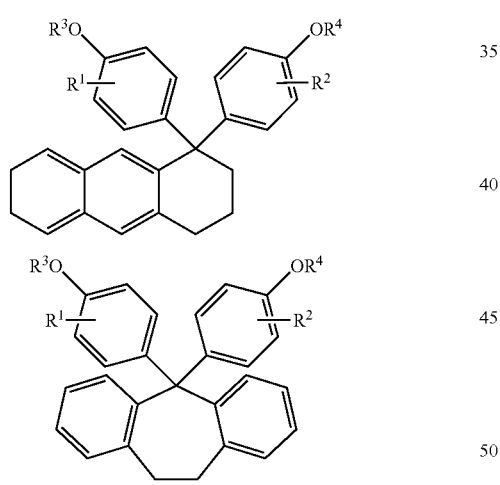
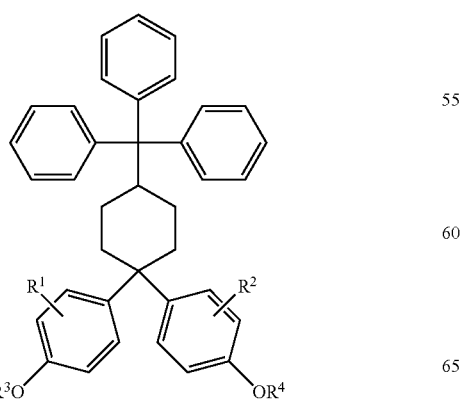
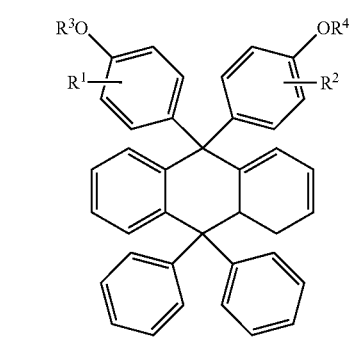

-continued

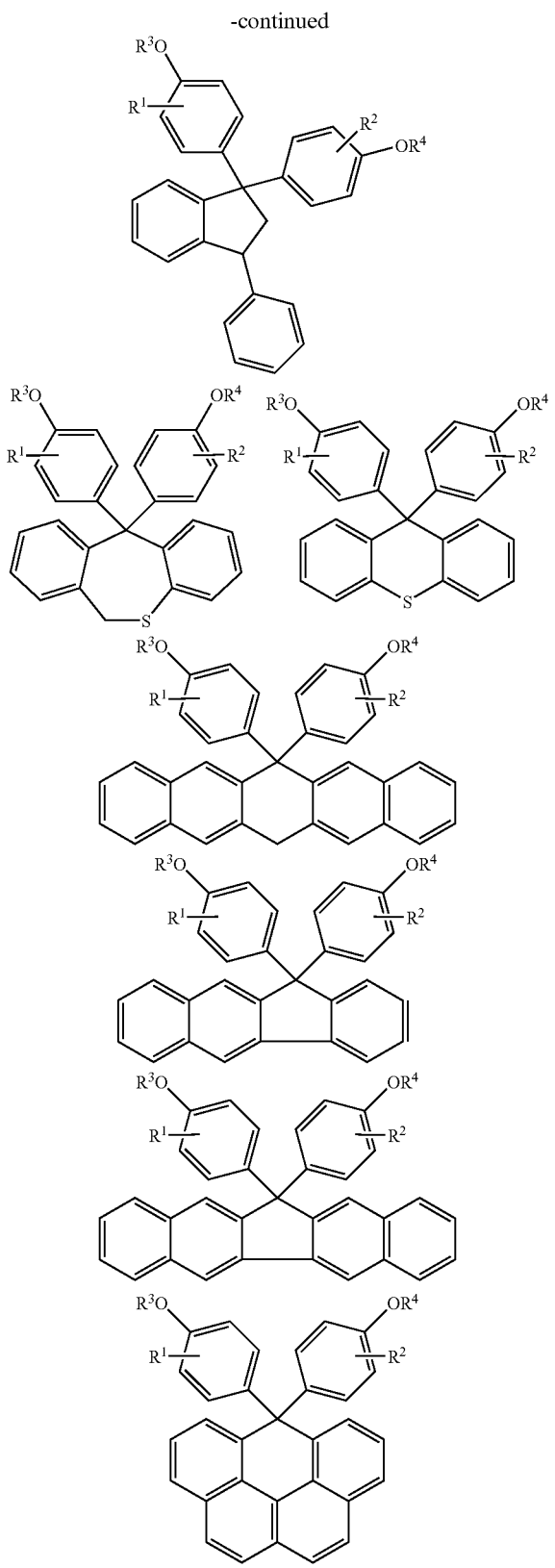

Herein $R^1$, $R^2$, $R^3$ and $R^4$ are as defined above. Preferably $R^3$ and $R^4$ are hydrogen atoms or glycidyl groups, and most preferably hydrogen atoms.

Those compounds of formula (1) wherein $R^3$ and $R^4$ are H may be obtained by reacting a phenol with a corresponding cyclic ketone in a conventional way. Those compounds of formula (1) wherein $R^3$ and $R^4$ are glycidyl groups may be obtained by converting the phenolic hydroxyl group on the phenol into a glycidyl group in a conventional way. Those compounds of formula (1) wherein $R^3$ and $R^4$ are alkyl, alkenyl, aryl, acetal or acyl groups may be similarly obtained by converting the phenolic hydroxyl groups into the desired groups in a conventional way.

On use of the specific bisphenol compound as the undercoat layer according to the invention, the compound of formula (1) itself may be added to form an undercoat layer. Alternatively, the bisphenol compound of formula (1) may be previously converted to a novolac form through condensation reaction with an aldehyde, that is, a resin comprising recurring units of formula (2) may be added.

Examples of the aldehyde which can be used herein include formaldehyde, trioxan, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, and furfural. Inter alia, formaldehyde is most preferred. The aldehydes may be used alone or in admixture. An appropriate amount of the aldehyde used in 0.2 to 5 moles, more preferably 0.5 to 2 moles per mole of the phenol.

Catalysts may be used in the condensation reaction of phenols with aldehydes. Suitable catalysts include acidic catalysts such as hydrochloric acid, nitric acid, sulfuric acid, formic acid, oxalic acid, acetic acid, methanesulfonic acid, camphorsulfonic acid, tosylic acid, and trifluoromethanesulfonic acid. An appropriate amount of the acidic catalyst used is $1 \times 10^{-5}$ to $5 \times 10^{-1}$ mole per mole of the phenol.

The aldehyde is not necessarily needed in the event of copolymerization reaction with compounds having an unconjugated double bond such as indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene.

The polycondensation may be conducted in a reaction medium which is typically water, methanol, ethanol, propanol, butanol, tetrahydrofuran, dioxane or a mixture thereof. The solvent is used in an amount of 0 to 2,000 parts by weight per 100 parts by weight of the reactants.

An appropriate reaction temperature may be selected depending on the reactivity of the reactants, and usually in the range of 10 to 200° C.

The condensation reaction may be conducted by charging the bisphenol, aldehyde and catalyst all at once, or by adding dropwise the bisphenol and aldehyde in the presence of the catalyst.

Once the polycondensation reaction is completed, the unreacted reactants, catalyst and the like may be removed from the system by elevating the temperature of the reactor vessel to 130 to 230° C. for evaporating off the volatiles at about 1 to 50 mmHg.

The bisphenol of formula (1) may be polymerized alone or copolymerized with another phenol.

Examples of the phenol which can be copolymerized include phenol, o-cresol, m-cresol, p-cresol, 2,3-dimethylphenol, 2,5-dimethylphenol, 3,4-dimethylphenol, 3,5- dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol.

Besides, any copolymerizable monomers may be further copolymerized. Examples of suitable monomers include 1-naphthol, 2-naphthol, 2-methyl-1-naphthol, 4-methoxy-1-naphthol, 7-methoxy-2-naphthol and dihydroxynaphthalenes such as 1,5-dihydroxynaphthalene, 1,7-dihydroxynaphthalene, and 2,6-dihydroxynaphthalene; methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene. Copolymers of three or more components including any of these monomers are acceptable.

The novolac resin thus obtained should preferably include 10 to 100 mol %, more preferably 30 to 100 mol % of the recurring units of formula (2). The content of recurring units derived from the copolymerizable phenol is preferably 0 to 90 mol %, more preferably 0 to 70 mol %, and the content of recurring units derived from the copolymerizable monomer is preferably 0 to 90 mol %, more preferably 0 to 70 mol %.

The novolac resin should preferably have a weight average molecular weight (Mw) in the range of about 1,000 to about 30,000, more preferably about 2,000 to about 20,000, as measured by gel permeation chromatography (GPC) versus polystyrene standards. Their molecular weight distribution or dispersity (Mw/Mn) is preferably in the range of 1.2 to 7. A narrow dispersity which is arrived at by cutting off monomer components, oligomeric components or low molecular weight components having a Mw of not more than 1,000 offers benefits of more efficient crosslinking and reduced amounts of volatile components during baking, preventing contamination around the baking cup.

Into the novolac resin after condensation, a fused aromatic or alicyclic substituent group may be subsequently introduced at the ortho-position relative to phenol, using an acidic catalyst.

Illustrative examples of the substituent group which can be introduced are given below.

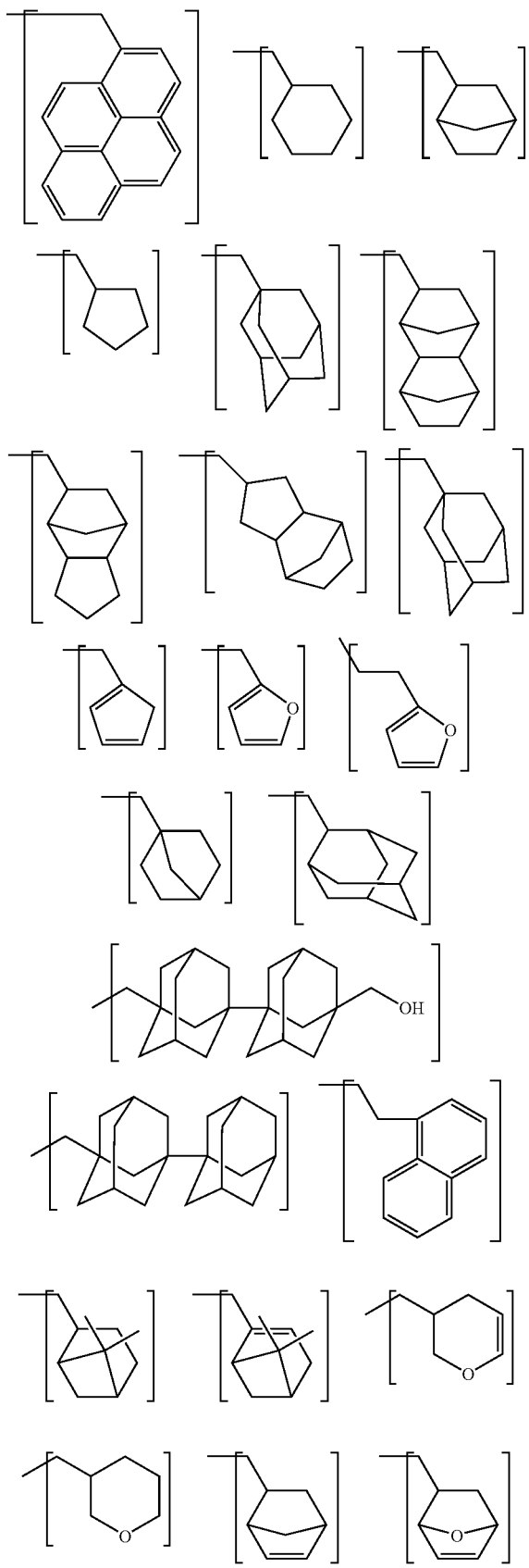

-continued

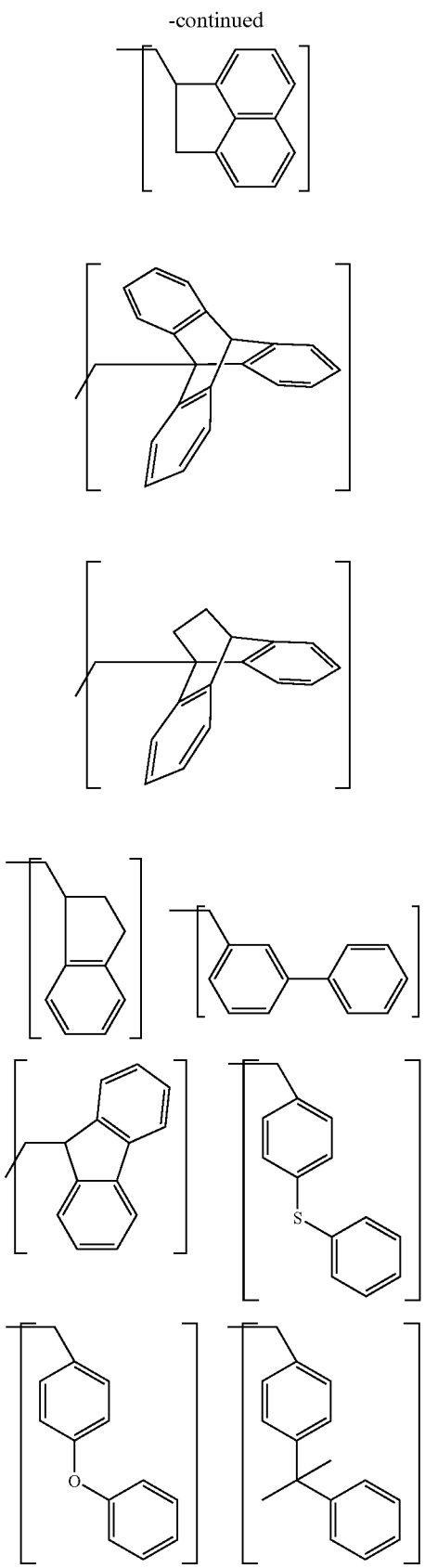

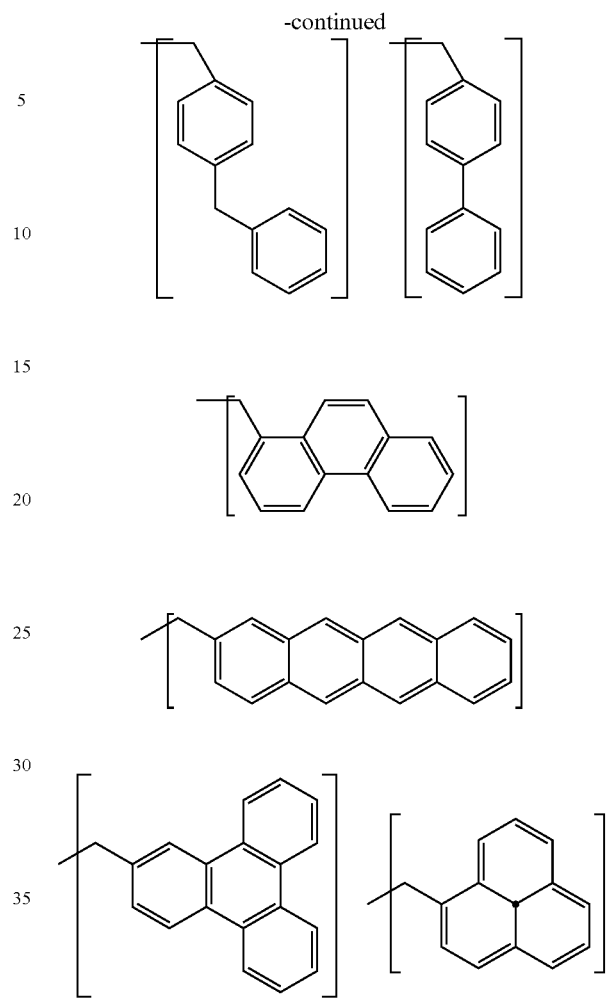

Of these substituent groups, polycyclic aromatic groups such as anthracenemethyl and pyrenemethyl groups are most preferred for 248-nm exposure. Those groups having alicyclic and naphthalene structures are preferred for improved transparency at 193 nm. In contrast, since the benzene ring has a window of improved transparency at the wavelength 157 nm, the absorption wavelength must be shifted so as to increase the absorption. The furan ring has absorption at a shorter wavelength than the benzene ring and is thus improved in absorption at 157 nm, but to a very small extent. Naphthalene, anthracene and pyrene rings are preferably used because of increased absorption due to a shift of the absorption wavelength to longer side and because these aromatic rings have the additional advantage of improved etching resistance.

The method of introducing a substituent group is by adding an alcohol whose hydroxyl group provides an attachment site of the substituent group to the polymer as polymerized in the presence of an acid catalyst, for thereby introducing the substituent group at the ortho- or para-position relative to the hydroxy group on the phenol. Suitable acid catalysts include acidic catalysts such as hydrochloric acid, nitric acid, sulfuric acid, formic acid, oxalic acid, acetic acid, methanesulfonic acid, n-butanesulfonic acid, camphorsulfonic acid, tosylic acid, and trifluoromethanesulfonic acid. An appropriate amount of the acidic catalyst used is $1\times10^{-5}$ to $5\times10^{-1}$ mole per mole of the phenol. An appropriate amount of the substituent group introduced is in the range of 0 to 0.8 mole per mole of hydroxyl group on the phenol.

The inventive resin comprising recurring units of formula (2) can be hydrogenated to further improve its transparency at 193 nm. The degree of hydrogenation is preferably up to 80 mol %, more preferably up to 60 mol % of the aromatic groups.

Further, the inventive resin can be blended with another polymer. Preferred for this blending purpose are polymers which can serve the functions of improving film formation by spin coating and burying in stepped substrates when mixed with the compound of formula (1) or the novolac resin comprising recurring units of formula (2). More preferably a choice may be made of materials having a high carbon density and etching resistance. Suitable materials include novolac resins derived from phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene) bisphenol, 2,2'-difluoro-4,4'-(9H-fluoren-9-ylidene) bisphenol, 2,2'-diphenyl-4,4'-(9H-fluoren-9-ylidene) bisphenol, 2,2'-dimethoxy-4,4'-(9H-fluoren-9-ylidene) bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, and dihydroxynaphthalenes such as 1,5-dihydroxynaphthalene, 1,7-dihydroxynaphthalene and 2,6-dihydroxynaphthalene, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, limonene, etc.; and polyhydroxystyrene, polystyrene, polyvinyl naphthalene, polyvinyl anthracene, polyvinyl carbazole, polyindene, polyacenaphthylene, polynorbornene, polycyclodecene, polytetracyclododecene, polynortricyclene, poly(meth)acrylate, and copolymers thereof.

The amount of the blending polymer compounded is usually 0 to 1,000 parts by weight, preferably 0 to 500 parts by weight per 100 parts by weight of the compound of formula (1) or the resin of formula (2).

One of the functions required for the undercoat layer including an antireflective film is the elimination of intermixing with the overcoat layer (i.e., silicon-containing intermediate layer and resist layer) and the elimination of diffusion of low molecular weight components into the overcoat layer (see Proc. SPIE Vol. 2195, pp. 225-229 (1994)). One common means for preventing intermixing and diffusion is by baking an antireflective film as spin coated for inducing thermal crosslinkage. Then, in the event the antireflective film material contains a crosslinker, a method of introducing crosslinkable substituent groups into the polymer may be employed. Absent a particular crosslinker, the specific bisphenol compound with a group of many carbon atoms represented by formula (1) and a novolac resin comprising recurring units derived by novolac formation of a bisphenol compound, as represented by the general formula (2) can be crosslinked by heating at a temperature of 300° C. or higher for inducing condensation reaction of hydroxyl groups.

Crosslinker

Examples of the crosslinker which can be used herein include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Also useful as the crosslinker are alcoholic group-containing compounds and low-nuclear phenol compounds whose hydroxyl group is converted to a glycidyl ether form using epichlorohydrin. Suitable alcoholic group-containing compounds include naphthol novolac, m- and p-cresol novolac, naphthol-dicyclopentadiene novolac, m- and p-cresol-dicyclopentadiene novolac, 4,8-bis(hydroxymethyl)tricyclo[$5.2.1.0^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy. Suitable low-nuclear phenol compounds include bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl) bisphenol, 4,4'-(diethylsilylene)bisphenol, 4,4'-[2,2,2-trifluoro-1-(trifluoromethyl)ethylidene]-bisphenol, 4,4',4"-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4"-ethylidyne tris[2-methylphenol], 4,4',4"-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4",4'"-(1,2-ethanediylidene)tetrakisphenol, 4,4',4",4'"-(1,2-ethanediylidene)tetrakis[2-methylphenol], 2,2'-methylenebis[6-[(2-hydroxy-5-methylphenyl)methyl]-4-methylphenol], 4,4',4",4'"-(1,4-phenylenedimethylidyne)tetrakisphenol, 2,4,6-tris(4-hydroxyphenylmethyl)-1,3-benzenediol, 2,4',4"-methylidenetrisphenol, 4,4',4'"-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol, 2,2'-methylenebis[6-[(3,5-dimethyl-4-hydroxyphenyl)methyl]-4-methylphenol, 4,4',4",4'"-tetrakis[(1-methylethylidene)bis(1,4-cyclohexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

In the inventive undercoat-forming material, the crosslinker is preferably compounded in an amount of 3 to 50 parts by weight, more preferably 5 to 40 parts by weight per 100 parts by weight of the total of the compound of formula (1), the resin comprising recurring units of formula (2) and the blending polymer (the total being referred to as "base polymer," hereinafter). Less than 3 pbw of the crosslinker may allow for mixing with the resist. More than 50 pbw of the crosslinker may invite a degraded antireflection effect, cracking of the crosslinked film or a lowering of etching resistance due to a drop of carbon density.

Acid Generator

In the practice of the invention, an acid generator may be added to accelerate the thermally induced crosslinking reaction. Acid generators include those which generate an acid through pyrolysis and those which generate an acid upon exposure to light, and both are useful.

The acid generators used herein include
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1a-3):

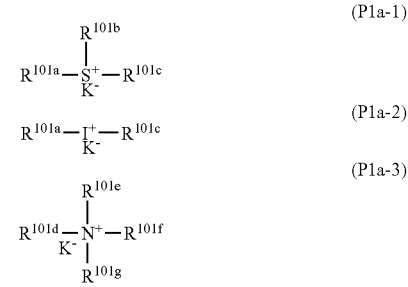

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring. $R^{101d}$, $R^{101e}$, $R^{101f}$, and $R^{101g}$, taken together, may stand for a heterocyclic aromatic ring having the nitrogen atom (in the formula) incorporated therein.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by K⁻ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

Examples of the heterocyclic aromatic ring having the nitrogen atom (in formula (P1a-3)) incorporated therein, represented by $R^{101d}$, $R^{101e}$, $R^{101f}$, and $R^{101g}$ include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (P1a-1) and (P1a-2) have both the functions of a photoacid generator and a thermal acid generator while the salts of (P1a-3) function as a thermal acid generator.

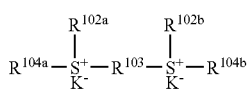
(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. K⁻ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1), (P1a-2) and (P1a-3).

(ii) Diazomethane Derivatives of Formula (P2)

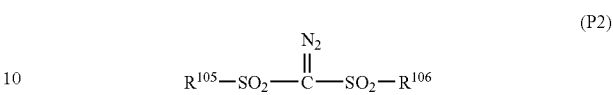
(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

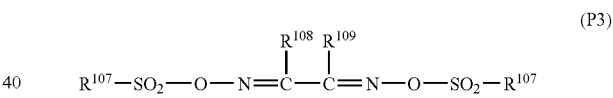
(P3)

Herein $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

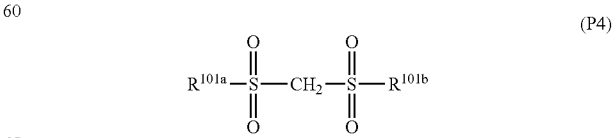
(P4)

Herein, $R^{101a}$ and $R^{101b}$ are as defined above.

(v) Sulfonic Acid Esters of N-Hydroxyimide Compounds of Formula (P5)

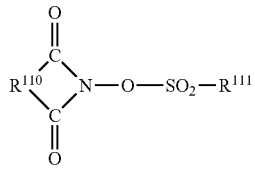

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
triethylammonium nonafluorobutanesulfonate,
pyridinium nonafluorobutanesulfonate,
triethylammonium camphorsulfonate,
pyridinium camphorsulfonate,
tetra-n-butylammonium nonafluorobutanesulfonate,
tetraphenylammonium nonafluorobutanesulfonate,
tetramethylammonium p-toluenesulfonate,
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime, bis-O-(n-butanesulfonyl)-2,3-pentanedioneglyoxime,
bis-O-(n-butanesulfonyl)-2-methyl-3,4-pentanedionegly-
  oxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
  bissulfone derivatives such as
bisnaphthylsulfonylmethane, bistrifluoromethylsulfonyl-
  methane,
bismethylsulfonylmethane, bisethylsulfonylmethane,
bispropylsulfonylmethane, bisisopropylsulfonylmethane,
bis-p-toluenesulfonylmethane, and bisbenzenesulfonyl-
  methane;
  β-ketosulfone derivatives such as
2-cyclohexylcarbonyl-2-(p-toluenesulfonyl)propane and
2-isopropylcarbonyl-2-(p-toluenesulfonyl)propane;
  disulfone derivatives such as diphenyl disulfone deriva-
tives and dicyclohexyl disulfone derivatives;
  nitrobenzyl sulfonate derivatives such as
2,6-dinitrobenzyl p-toluenesulfonate and
2,4-dinitrobenzyl p-toluenesulfonate;
  sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
  sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methane-
  sulfonate,
N-hydroxy-5-norbornene-2,3-dicarboxyimide trifluo-
  romethanesulfonate, and
N-hydroxy-5-norbornene-2,3-dicarboxyimide p-toluene-
  sulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl) sulfonium trifluoromethanesulfonate, and 1,2'-naphthylcarbonylmethyltetrahydrothiophenium triflate;

diazomethane derivatives such as bis(benzenesulfonyl) diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime;

bissulfone derivatives such as bisnaphthylsulfonylmethane;

and sulfonic acid esters of N-hydroxyimide compounds such as N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combinations of two or more thereof. The acid generator is preferably added in an amount of 0.1 to 50 parts by weight, and especially 0.5 to 40 parts by weight, per 100 parts by weight of the base polymer. Less than 0.1 pbw of the acid generator generates an insufficient amount of acid to induce crosslinking reaction whereas more than 50 pbw of the acid generator may invite a mixing phenomenon that the acid migrates into the overlying resist.

Basic Compound

In the undercoat-forming material of the invention, a basic compound may be compounded for improving the storage stability. The basic compound plays the role of an acid quencher for preventing a small amount of acid generated from the acid generator from promoting the crosslinking reaction.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-isobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.001 to 2 parts by weight, and especially 0.01 to 1 part by weight, per 100 parts by weight of the base polymer. Less than 0.001 pbw of the basic compound may fail to provide the desired effect whereas more than 2 pbw of the basic compound may trap the entirety of thermally generated acid to inhibit crosslinking reaction.

Organic Solvent

The organic solvent used in the undercoat-forming material of the invention may be any organic solvent in which the base polymer, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate, propylene glycol monomethyl ether acetate and propylene glycol monomethyl ether, and mixtures thereof.

The organic solvent is preferably added in an amount of about 200 to 10,000 parts by weight, especially about 300 to 5,000 parts by weight per 100 parts by weight of the base polymer.

Like photoresists, the undercoat-forming material of the invention can be applied onto a processable substrate by any desired technique such as spin coating, to form an undercoat layer thereon. After spin coating, the coating is desirably baked in order to evaporate off the solvent and to promote crosslinking reaction for preventing the undercoat layer from mixing with the overlying resist. The baking is preferably effected at a temperature of 80 to 300° C. for a time of 10 to 300 seconds. The thickness of the undercoat layer may be suitably determined although it is preferably in the range of 30 to 20,000 nm, especially 50 to 15,000 nm.

Once the undercoat layer is formed, a silicon-containing resist layer is formed thereon in the case of bilayer process, and a silicon-containing intermediate layer is formed thereon and a silicon-free monolayer resist layer is formed on the intermediate layer in the case of tri-layer process. Any of well-known photoresist compositions may be used to form the resist layer.

As the silicon-containing resist composition for the bilayer process, a positive photoresist composition comprising a silicon atom-containing polymer such as a polysilsesquioxane derivative or vinylsilane derivative as a base polymer, an organic solvent, a photoacid generator, and optionally, a basic compound or the like is often used from the standpoint of oxygen gas etching resistance. As the silicon atom-containing polymer, any of well-known polymers which are used in resist compositions of this type may be used.

As the silicon-containing intermediate layer for the tri-layer process, an intermediate layer based on polysilsesquioxane is preferably used. The intermediate layer having the function of an antireflective coating is effective for restraining reflection.

Especially for 193-nm exposure, while the use of a material containing more aromatic groups and having high resistance to substrate etching as the undercoat layer provides a high k value and high substrate reflection, the combined use of an intermediate layer that restrains reflection is successful in reducing the substrate reflection to 0.5% or less. As the intermediate layer having an antireflective effect, use is preferably made of polysilsesquioxane having anthracenyl groups as pendants for 248 and 157-nm exposure and polysilsesquioxane having phenyl groups or photo-absorbing groups having a silicon-to-silicon bond as pendants and capable of acid- or heat-assisted crosslinking for 193-nm exposure.

Also, an intermediate layer formed by chemical vapor deposition (CVD) may be used. Know intermediate layers formed by CVD and having the increased function of an antireflective coating are SiON coatings. As compared with the CVD, formation of an intermediate layer by a spin coating technique is simple and economical. The topcoat resist in the tri-layer process may be either positive or negative and may be the same as a commonly used monolayer resist.

When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired pattern, post-exposure baked (PEB) and developed with a liquid developer, obtaining a resist pattern. The thickness of the resist layer is preferably in a range of 30 to 500 nm, more preferably 50 to 400 nm, though not critical. The radiation for exposure may be selected from among high-energy radiation having a wavelength of up to 300 nm, specifically excimer laser beams of 248 nm, 193 nm and 157 nm, soft X-rays of 3 to 20 nm, electron beams, and X-rays.

Next, etching is carried out using the resist pattern as a mask. In the bilayer process, the undercoat layer is typically etched with oxygen gas. In addition to oxygen gas, an inert gas such as He or Ar or another gas such as $CO$, $CO_2$, $NH_3$, $SO_2$, $N_2$, $NO_2$ or $H_2$ may be added to the etching gas. The other gas is used for sidewall protection, that is, for preventing the pattern sidewalls from being undercut. Etching solely with $CO$, $CO_2$, $NH_3$, $SO_2$, $NO_2$ or $H_2$ gas without using oxygen gas is also acceptable. In the tri-layer process, the intermediate layer is etched with a fluorocarbon-base gas using the patterned resist as a mask. Then the undercoat layer is etched with oxygen gas (same as above) using the patterned intermediate layer as a mask.

Next, the processable substrate is etched by a conventional technique. For example, when the substrate is $SiO_2$ or SiN, etching with a fluorocarbon-base gas is employed. When the substrate is p-Si, Al or W, etching with a chlorine or bromine-base gas is employed. When the substrate processing is etching with a fluorocarbon-base gas, the silicon-containing resist in the bilayer resist process and the silicon-containing intermediate layer in the tri-layer process are stripped at the same time as the substrate processing. When the substrate is etched with a chlorine or bromine-base gas, the silicon-containing resist or the silicon-containing intermediate layer must be subsequently stripped by dry etching with a fluorocarbon-base gas after the substrate processing.

The undercoat layer of the invention is resistant to the etching of the substrate with any of such gases.

The processable substrate is formed on a support substrate. The support substrate includes those of Si, α-Si, p-Si, $SiO_2$, SiN, SiON, W, TiN, Al and the like, and a suitable material different from the processable film (or processable substrate) is selected among them. The processable film is selected from low-k films of Si, $SiO_2$, SiON, SiN, p-Si, α-Si, W, W—Si, Al, Cu, Al—Si and the like and stop films thereof, and typically has a thickness of 50 to 10,000 nm, especially 100 to 5,000 nm.

The patterning process of the invention involves the steps of applying a photoresist undercoat-forming material onto a substrate to form an undercoat layer, applying a layer of a photoresist composition over the undercoat layer, optionally with an intermediate layer interposed therebetween, exposing the photoresist layer in a predetermined region to radiation, developing the photoresist layer with a liquid developer to form a resist pattern, and processing the undercoat layer and the substrate through the patterned photoresist layer as a mask, by means of a dry etching apparatus. Now referring to FIGS. 6 and 7, the bilayer resist working process and trilayer resist working process are illustrated.

Figure 6A:
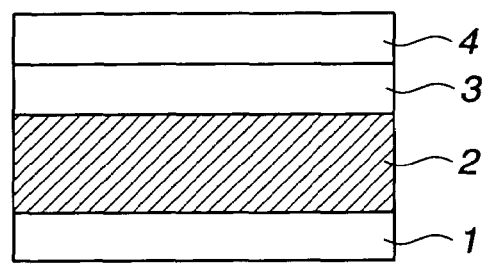
FIG. 6 illustrates steps of a bilayer resist working process.
Figure 6B:
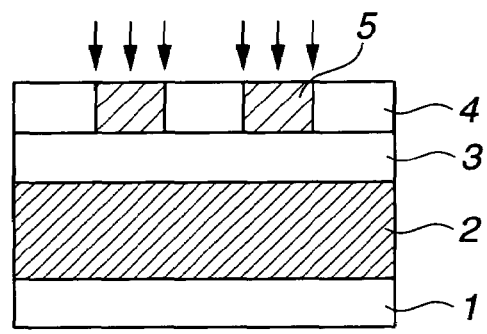
Figure 6C:
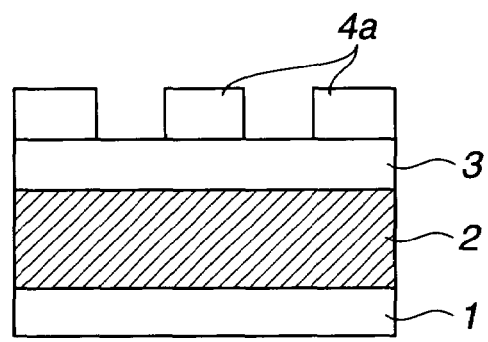
Figure 6D:
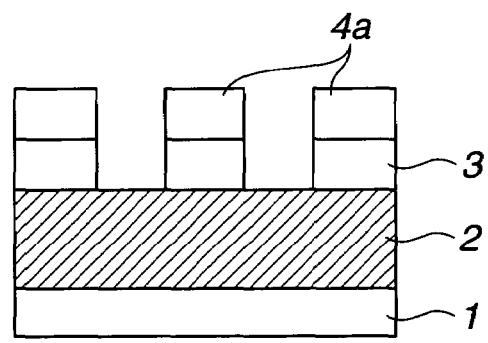
Figure 6E:
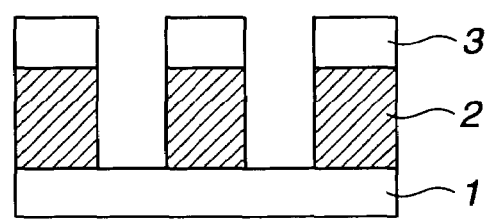

In the bilayer resist working process, as shown in FIG. 6A, an undercoat-forming material is applied onto a processable substrate (or film) 2 lying on a support substrate 1 to form an undercoat layer 3. A photoresist composition, especially a photoresist composition comprising a silicon atom-containing polymer as a base resin is then applied onto the undercoat layer 3 to form a photoresist layer 4. Through a photomask (not shown), a predetermined region 5 of the photoresist layer 4 is exposed to light as shown in FIG. 6B. By subsequent PEB and development, a patterned photoresist layer 4a is formed as shown in FIG. 6C. Thereafter, as shown in FIG. 6D, the undercoat layer 3 is etched with an oxygen plasma using the patterned photoresist layer 4a as a mask. The patterned photoresist layer 4a is removed, after which the processable substrate 2 is processed by etching as shown in FIG. 6E.

Figure 7A:
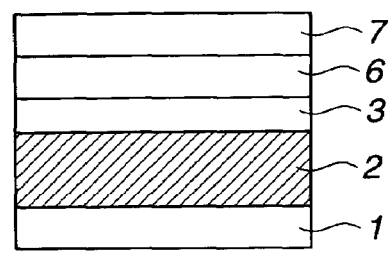
FIG. 7 illustrates steps of a trilayer resist working process.
Figure 7B:
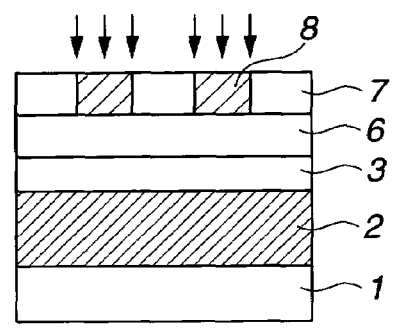
Figure 7C:
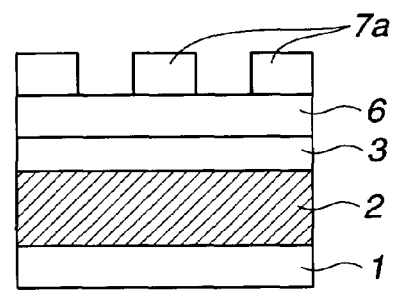
Figure 7D:
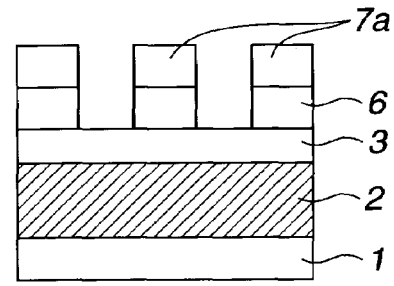
Figure 7E:
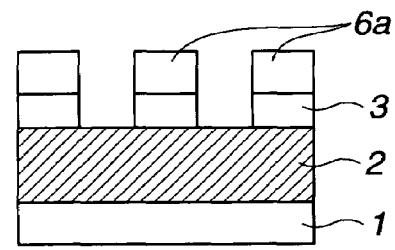
Figure 7F:
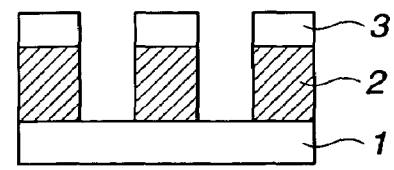

In the trilayer resist working process, as shown in FIG. 7A, an undercoat-forming material is applied onto a processable substrate (or film) 2 lying on a support substrate 1 to form an undercoat layer 3, in the same manner as in the bilayer resist process. A silicon-containing intermediate layer 6 is then formed on the undercoat layer 3, and a single layer photoresist layer 7 is formed on the intermediate layer 6. Next, as shown in FIG. 7B, a predetermined region 8 of the photoresist layer 7 is exposed to light. By subsequent PEB and development, a patterned photoresist layer 7*a* is formed as shown in FIG. 7C. Using the patterned photoresist layer 7*a* as a mask, the intermediate layer 6 is etched with a fluorocarbon (CF) base gas as shown in FIG. 7D. The patterned photoresist layer 7*a* is removed, after which the undercoat layer 3 is etched with an oxygen plasma using the patterned intermediate layer 6*a* as a mask as shown in FIG. 7E. Finally, the patterned intermediate layer 6*a* is removed, after which the processable substrate 2 is processed by etching as shown in FIG. 7F.

EXAMPLE

Synthesis Examples and Examples are given below together with Comparative Examples for further illustrating the invention although the invention is not limited thereby.

It is noted that a molecular weight is measured by the following procedure. A polymer is analyzed by gel permeation chromatography (GPC) using polystyrene standards, for determining a weight average molecular weight (Mw) and a number average molecular weight (Mn), from which a dispersity (Mw/Mn) is computed.

Synthesis Example 1

A 300-ml flask was charged with 200 g of Compound 1, shown below, 75 g of 37% formalin in water, and 5 g of oxalic acid. With stirring, reaction took place at 100° C. for 24 hours. At the end of reaction, the reaction solution was dissolved in 500 ml of methyl isobutyl ketone, thoroughly washed with water to remove the catalyst and metal impurities, and heated in vacuo to evaporate off the solvent. This was followed by evacuation to 2 mmHg at 150° C. to remove water and the unreacted monomers, leaving 163 g of Polymer 1, shown below.

The molecular weight (Mw) and dispersity (Mw/Mn) of Polymer 1 were determined by GPC. From $^1$H-NMR analysis, the ratio of monomer units in the polymer was determined.

Mw=8,000

Mw/Mn=4.30

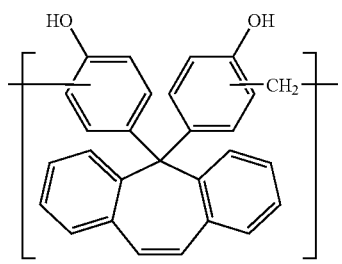

Polymer 1

Synthesis Example 2

A 300-ml flask was charged with 200 g of Compound 2, shown below, 75 g of 37% formalin in water, and 5 g of oxalic acid. With stirring, reaction took place at 100° C. for 24 hours. At the end of reaction, the reaction solution was dissolved in 500 ml of methyl isobutyl ketone, thoroughly washed with water to remove the catalyst and metal impurities, and heated in vacuo to evaporate off the solvent. This was followed by evacuation to 2 mmHg at 150° C. to remove water and the unreacted monomers, leaving 188 g of Polymer 2, shown below.

The molecular weight (Mw) and dispersity (Mw/Mn) of Polymer 2 were determined by GPC. From $^1$H-NMR analysis, the ratio of monomer units in the polymer was determined.

Mw=9,500

Mw/Mn=4.80

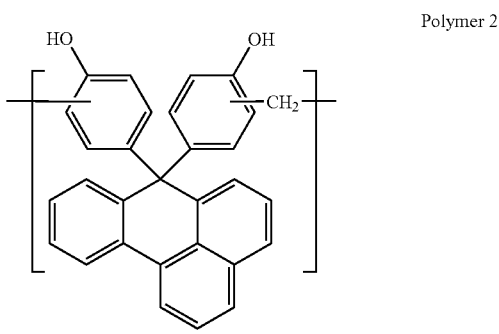

Polymer 2

Compounds 1 to 6, shown below, were used as the specific bisphenol compound with a group of many carbon atoms.

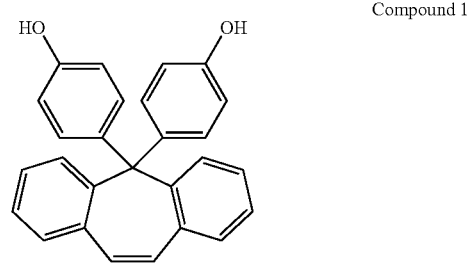

Compound 1

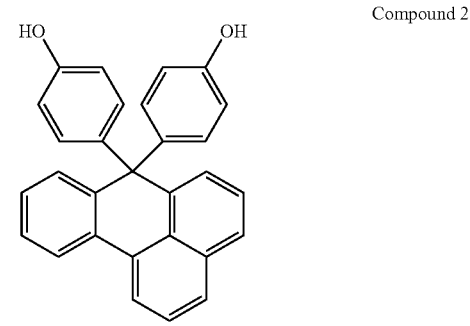

Compound 2

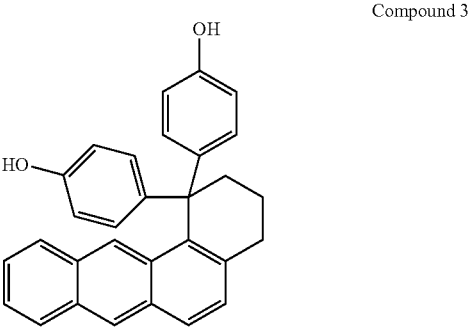

Compound 3

-continued

Compound 4

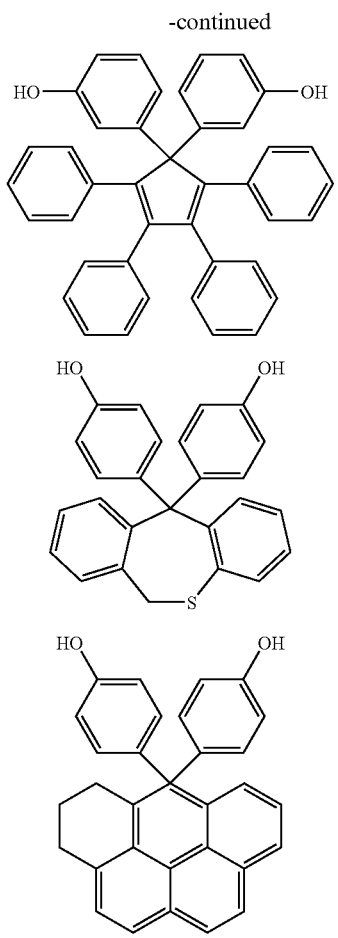

Compound 5

Compound 6

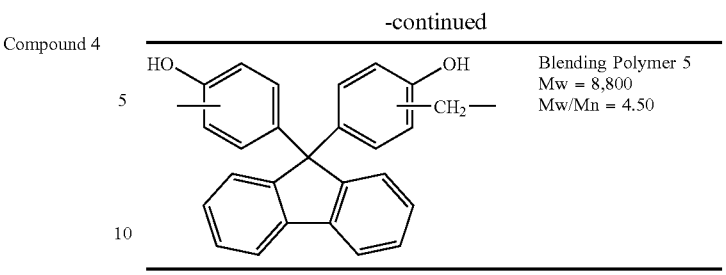

Blending Polymer 5
Mw = 8,800
Mw/Mn = 4.50

Comparative Polymer 1 is a copolymer of 4-hydroxystyrene and 1-anthracenemethyl 2-methacrylate in a ratio of 56:44 by radical polymerization, having a weight average molecular weight Mw of 14,400 and a dispersity Mw/Mn of 1.77. Comparative Polymer 2 is a m-cresol novolac resin having Mw=8,800 and Mw/Mn=4.5. Comparative Polymer 3 is polyhydroxystyrene having Mw=9,200 and Mw/Mn=1.05.

Examples and Comparative Examples

An undercoat layer-coating solution and an intermediate layer-coating solution were prepared by dissolving one or more of resins designated Polymers 1-2, resins designated blending Polymers 3-5, resins designated Comparative Polymers 1-3, and specific bisphenol compounds with a group of many carbon atoms designated Compounds 1-6, or a Si-containing Polymer 1 for ArF intermediate layer, an acid generator (AG1), and a crosslinker (CR1, 2) in a solvent containing 0.1 wt % of Fluorad FC-430 (3M-Sumitomo Co., Ltd.) according to the formulation shown in Table 1, and passing through a fluoroplastic filter having a pore size of 0.1 μm.

As the blending polymer, Polymer 3 is an indene-hydroxystyrene copolymer obtained through cationic polymerization, Polymer 4 is an acenaphthylene-hydroxystyrene copolymer obtained through cationic polymerization, and Polymer 5 is a novolac resin obtained by reacting 4,4'-(9H-fluoren-9-ylidene)bisphenol with formalin. These blending Polymers 3 to 5 have the structure, monomer ratio and molecular weight shown below.

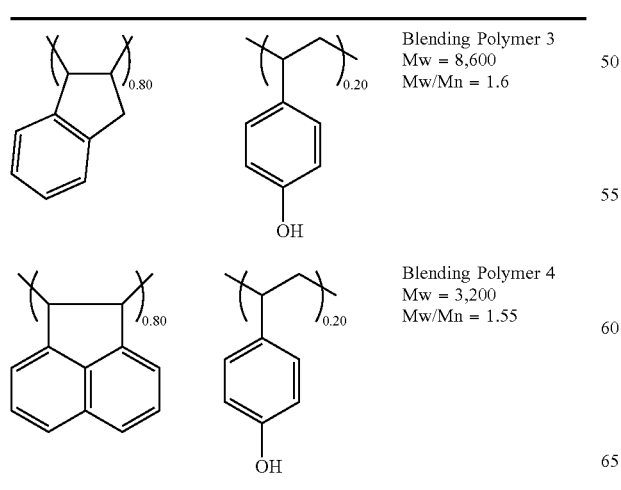

Blending Polymer 3
Mw = 8,600
Mw/Mn = 1.6

Blending Polymer 4
Mw = 3,200
Mw/Mn = 1.55

AG1

CR1

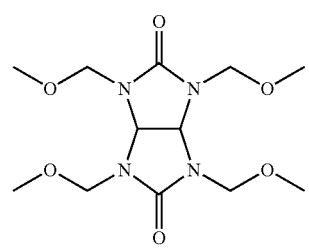

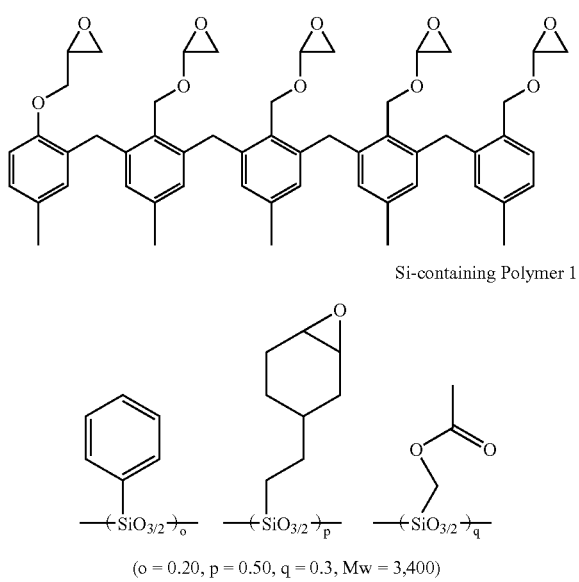

Si-containing Polymer 1

(o = 0.20, p = 0.50, q = 0.3, Mw = 3,400)

An overcoat resist material was prepared by dissolving a resin, acid generator, and basic compound in a solvent containing 0.1 wt % of Fluorad FC-430 (3M-Sumitomo Co., Ltd.) according to the formulation shown in Table 2, and passing through a fluoroplastic filter having a pore size of 0.1 μm.

The undercoat-forming material solution was applied onto a silicon substrate and baked at 300° C. for 60 seconds to form a polymer layer of 300 nm thick (designated UDL1, 2) as the undercoat layer or baked at 200° C. for 60 seconds to form a polymer layer of 300 nm thick (designated UDL3-14 and Comparative UDL1-3) as the undercoat layer. The intermediate layer-coating solution was spin coated and baked at 200° C. for 60 seconds to form a silicon-containing layer of 100 nm thick (designated SOG1) as the intermediate layer. Using a variable angle spectroscopic ellipsometer (VASE®) of J. A. Woollam Co., the refractive index (n, k) at wavelength 193 nm of UDL1 to UDL14, SOG1 and Comparative UDL1 to UDL3 was determined. The results are also shown in Table 1.

TABLE 1

| No. | Bisphenol compound (pbw) | Polymer (pbw) | Crosslinker (pbw) | Acid generator (pbw) | Solvent (pbw) | Refractive index (193 nm) n | Refractive index (193 nm) k |
|---|---|---|---|---|---|---|---|
| UDL1 | — | Polymer 1 (20) | — | — | PGMEA (100) | 1.30 | 0.48 |
| UDL2 | — | Polymer 2 (20) | — | — | PGMEA (100) | 1.33 | 0.45 |
| UDL3 | Compound 1 (28) | — | CR1 (3.0) | AG1 (0.1) | PGMEA (100) | 1.32 | 0.50 |
| UDL4 | Compound 2 (28) | — | CR1 (3.0) | AG1 (0.1) | PGMEA (100) | 1.35 | 0.48 |
| UDL5 | Compound 1 (10) | Polymer 1 (10) | CR1 (2.0) | AG1 (0.1) | PGMEA (100) | 1.43 | 0.42 |
| UDL6 | Compound 2 (10) | Polymer 1 (10) | CR1 (2.0) | AG1 (0.1) | PGMEA (100) | 1.44 | 0.38 |
| UDL7 | Compound 3 (10) | Polymer 1 (10) | CR1 (2.0) | AG1 (0.1) | PGMEA (100) | 1.46 | 0.43 |
| UDL8 | Compound 4 (10) | Polymer 1 (10) | CR1 (2.0) | AG1 (0.1) | PGMEA (100) | 1.32 | 0.54 |
| UDL9 | Compound 5 (10) | Polymer 1 (10) | CR1 (2.0) | AG1 (0.1) | PGMEA (100) | 1.44 | 0.50 |
| UDL10 | Compound 1 (10) | Blending Polymer 3 (10) | CR1 (2.0) | AG1 (0.1) | PGMEA (100) | 1.38 | 0.55 |
| UDL11 | Compound 1 (10) | Blending Polymer 4 (10) | CR1 (2.0) | AG1 (0.1) | PGMEA (100) | 1.38 | 0.38 |
| UDL12 | Compound 1 (10) | Blending Polymer 5 (10) | CR1 (2.0) | AG1 (0.1) | PGMEA (100) | 1.33 | 0.50 |
| UDL13 | Compound 1 (10) | Polymer 1 (10) | CR2 (2.0) | AG1 (0.1) | PGMEA (100) | 1.44 | 0.45 |
| UDL14 | Compound 6 (10) | Polymer 1 (10) | CR1 (2.0) | AG1 (0.1) | PGMEA (100) | 1.41 | 0.40 |
| SOG1 | — | ArF Si-containing intermediate layer Polymer 1 (20) | — | AG1 (1) | PGMEA (1000) | 1.66 | 0.15 |
| Comparative UDL1 | — | Comparative Polymer 1 (28.0) | CR1 (2.0) | AG1 (1) | PGMEA (100) | 1.38 | 0.57 |
| Comparative UDL2 | — | Comparative Polymer 2 (28.0) | CR1 (2.0) | AG1 (1) | PGMEA (100) | 1.28 | 0.62 |

TABLE 1-continued

| No. | Bisphenol compound (pbw) | Polymer (pbw) | Crosslinker (pbw) | Acid generator (pbw) | Solvent (pbw) | Refractive index (193 nm) | |
|---|---|---|---|---|---|---|---|
| | | | | | | n | k |
| Comparative UDL3 | — | Comparative Polymer 3 (28.0) | CR1 (2.0) | AG1 (1) | PGMEA (100) | 1.62 | 0.58 |

PGMEA: propylene glycol monomethyl ether acetate

TABLE 2

| | Polymer (pbw) | Acid generator (pbw) | Basic compound (pbw) | Solvent (pbw) |
|---|---|---|---|---|
| SL resist for ArF | ArF SL resist polymer 1 (100) | PAG1 (2.2) | TMMEA (0.3) | PGMEA (1200) |

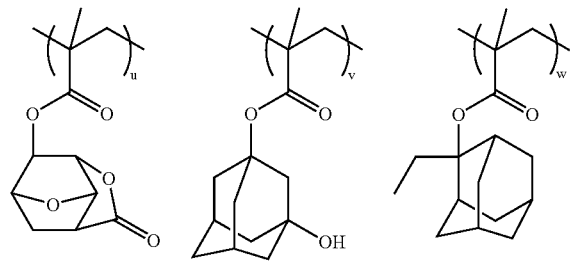

ArF single layer resist polymer 1
(u = 0.40, v = 0.30, w = 0.30, Mw = 7,800)

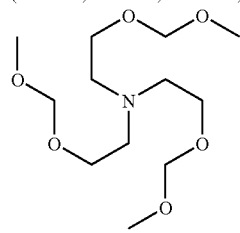

TMMEA

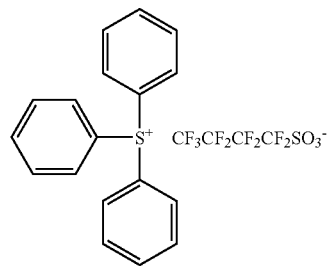

PAG1

Next, the undercoat-forming material solution (UDL1-14, Comparative UDL1-3) was applied onto a SiO$_2$ substrate of 300 nm thick and baked at 300° C. for 60 seconds in the case of UDL1, 2 or at 200° C. for 60 seconds in the case of UDL3-14 to form an undercoat layer of 200 nm thick.

The silicon-containing intermediate layer-forming material solution SOG1 was applied thereon and baked at 200° C. for 60 seconds to form an intermediate layer of 70 nm thick. Then the ArF exposure single layer resist solution was applied and baked at 130° C. for 60 seconds to form a photoresist layer of 150 nm thick.

Thereafter, the resist layer was exposed using an ArF laser stepper S307E (Nikon Corporation, NA 0.85, σ 0.93, 4/5 annular illumination, halftone phase shift mask with 6% transmittance), then baked (PEB) at 110° C. for 60 seconds, and developed for 60 seconds with a 2.38 wt % aqueous solution of tetramethylammonium hydroxide (TMAH), thereby giving a positive pattern. The profile of the 0.08 μm line-and-space pattern was observed. The results are shown in Table 5.

Finally, dry etching tests were conducted. There were prepared undercoat layers (UDL1-14, Comparative UDL1-3) as used for the measurement of refractive index. These undercoat layers were examined by a test (1) of etching with CF$_4$/CHF$_3$ gas using a dry etching instrument TE-8500P by Tokyo Electron K.K. A difference in thickness of the undercoat layer or resist before and after the etching test was determined, from which an etching rate per minute was computed. The results are shown in Table 3.

(1) CF$_4$/CHF$_3$ Gas Etching Test

| Chamber pressure | 40.0 Pa |
|---|---|
| RF power | 1300 W |
| Gap | 9 mm |
| CHF$_3$ gas flow rate | 30 ml/min |
| CF$_4$ gas flow rate | 30 ml/min |
| Ar gas flow rate | 100 ml/min |
| Time | 60 sec |

TABLE 3

| Antireflective film, resist No. | CF$_4$/CHF$_3$ gas etching rate (nm/min) |
|---|---|
| UDL1 | 68 |
| UDL2 | 56 |
| UDL3 | 72 |
| UDL4 | 69 |
| UDL5 | 70 |
| UDL6 | 69 |
| UDL7 | 70 |
| UDL8 | 61 |
| UDL9 | 62 |
| UDL10 | 66 |
| UDL11 | 65 |
| UDL12 | 78 |
| UDL13 | 73 |
| UDL14 | 70 |
| Comparative UDL1 | 144 |
| Comparative UDL2 | 120 |
| Comparative UDL3 | 129 |

The undercoat layers (UDL1-14, Comparative UDL1-3) were further examined by a test (2) of etching with Cl$_2$/BCl$_3$ gas using a dry etching instrument L-507D-L by Nichiden Anerba K.K. A difference in thickness of the polymer layer before and after the etching test was determined, from which an etching rate was computed. The results are shown in Table 4.

(2) $Cl_2/BCl_3$ Gas Etching Test

| | |
|---|---|
| Chamber pressure | 40.0 Pa |
| RF power | 300 W |
| Gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| Time | 60 sec |

TABLE 4

| Antireflective film, resist No. | $Cl_2/BCl_3$ gas etching rate (nm/min) |
|---|---|
| UDL1 | 73 |
| UDL2 | 70 |
| UDL3 | 78 |
| UDL4 | 81 |
| UDL5 | 79 |
| UDL6 | 73 |
| UDL7 | 77 |
| UDL8 | 68 |
| UDL9 | 70 |
| UDL10 | 74 |
| UDL11 | 73 |
| UDL12 | 80 |
| UDL13 | 78 |
| UDL14 | 74 |
| Comparative UDL1 | 166 |
| Comparative UDL2 | 132 |
| Comparative UDL3 | 140 |

Then, the resist pattern resulting from the ArF exposure and development was transferred to the SOG film by etching. The etching conditions (3) are given below.

(3) Transfer to SOG by Etching

| | |
|---|---|
| Chamber pressure | 40.0 Pa |
| RF power | 1000 W |
| Gap | 9 mm |
| $CHF_3$ gas flow rate | 20 ml/min |
| $CF_4$ gas flow rate | 60 ml/min |
| Ar gas flow rate | 200 ml/min |
| Time | 30 sec |

Next, the pattern transferred to the SOG film was further transferred to the undercoat layer by etching with oxygen-base gas. The etching conditions (4) are given below.

(4) Transfer to Undercoat by Etching

| | |
|---|---|
| Chamber pressure | 60.0 Pa |
| RF power | 600 W |
| Gap | 9 mm |
| Ar gas flow rate | 40 ml/min |
| $O_2$ gas flow rate | 60 ml/min |
| Time | 20 sec |

Finally, using the patterned undercoat layer as a mask, the $SiO_2$ substrate was processed under the etching conditions (1).

A cross section of the pattern was observed under an electron microscope S-4700 (Hitachi, Ltd.). The pattern profile was compared in this way, with the results shown in Table 5.

TABLE 5

| No. | Topcoat resist | Pattern profile after development | SOG profile after transfer etching | Undercoat profile after transfer etching | Substrate profile after transfer etching |
|---|---|---|---|---|---|
| UDL1 | SL resist for ArF | perpendicular | perpendicular | perpendicular | perpendicular |
| UDL2 | SL resist for ArF | perpendicular | perpendicular | perpendicular | perpendicular |
| UDL3 | SL resist for ArF | perpendicular | perpendicular | perpendicular | perpendicular |
| UDL4 | SL resist for ArF | perpendicular | perpendicular | perpendicular | perpendicular |
| UDL5 | SL resist for ArF | perpendicular | perpendicular | perpendicular | perpendicular |
| UDL6 | SL resist for ArF | perpendicular | perpendicular | perpendicular | perpendicular |
| UDL7 | SL resist for ArF | perpendicular | perpendicular | perpendicular | perpendicular |
| UDL8 | SL resist for ArF | perpendicular | perpendicular | perpendicular | perpendicular |
| UDL9 | SL resist for ArF | perpendicular | perpendicular | perpendicular | perpendicular |
| UDL10 | SL resist for ArF | perpendicular | perpendicular | perpendicular | perpendicular |
| UDL11 | SL resist for ArF | perpendicular | perpendicular | perpendicular | perpendicular |
| UDL12 | SL resist for ArF | perpendicular | perpendicular | perpendicular | perpendicular |
| UDL13 | SL resist for ArF | perpendicular | perpendicular | perpendicular | perpendicular |
| UDL14 | SL resist for ArF | perpendicular | perpendicular | perpendicular | perpendicular |
| Comparative UDL1 | SL resist for ArF | perpendicular | perpendicular | perpendicular | tapered and slimmed |

TABLE 5-continued

| No. | Topcoat resist | Pattern profile after development | SOG profile after transfer etching | Undercoat profile after transfer etching | Substrate profile after transfer etching |
| --- | --- | --- | --- | --- | --- |
| Comparative UDL2 | SL resist for ArF | perpendicular | perpendicular | perpendicular | tapered |
| Comparative UDL3 | SL resist for ArF | perpendicular | perpendicular | perpendicular | tapered |

It is seen from Tables 3 and 4 that when etched with $CF_4/CHF_3$ gas and $Cl_2/BCl_3$ gas, the undercoat layers within the scope of the invention exhibit significantly slower etching rates than the ordinary novolac resin and polyhydroxystyrene. As seen from Table 5, when the undercoat material is applied to the trilayer resist processing, the profile of resist after development, and the profile of undercoat layer after oxygen etching and after substrate processing by etching are satisfactory.

Japanese Patent Application No. 2005-069150 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photoresist undercoat-forming material comprising a bisphenol compound having the general formula (1):

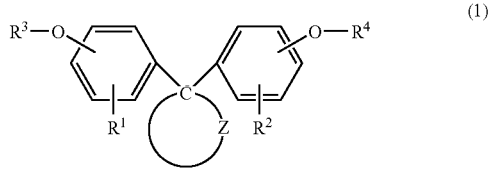

(1)

wherein $R^1$ and $R^2$ are each independently hydrogen, a straight, branched or cyclic $C_1$-$C_{10}$ alkyl group, $C_6$-$C_{10}$ aryl group or $C_2$-$C_{10}$ alkenyl group, $R^3$ and $R^4$ are each independently hydrogen, a straight, branched or cyclic $C_1$-$C_6$ alkyl group, straight, branched or cyclic $C_2$-$C_6$ alkenyl group, $C_6$-$C_{10}$ aryl group, $C_2$-$C_6$ acetal group, $C_2$-$C_6$ acyl group or glycidyl group, and Z is a divalent $C_{13}$-$C_{30}$ hydrocarbon group containing an aromatic skeleton or fused polycyclic hydrocarbon group, which may contain at least one hetero atom.

2. A photoresist undercoat-forming material comprising a resin comprising recurring units derived by novolac formation of a bisphenol compound, as represented by the general formula (2):

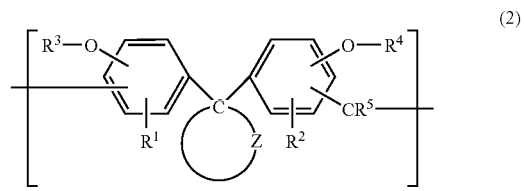

(2)

wherein $R^1$ and $R^2$ are each independently hydrogen, a straight, branched or cyclic $C_1$-$C_{10}$ alkyl group, $C_6$-$C_{10}$ aryl group or $C_2$-$C_{10}$ alkenyl group, $R^3$ and $R^4$ are each independently hydrogen, a straight, branched or cyclic $C_1$-$C_6$ alkyl group, straight, branched or cyclic $C_2$-$C_6$ alkenyl group, $C_6$-$C_{10}$ aryl group, $C_2$-$C_6$ acetal group, $C_2$-$C_6$ acyl group or glycidyl group, Z is a divalent $C_{13}$-$C_{30}$ hydrocarbon group containing an aromatic skeleton or fused polycyclic hydrocarbon group, which may contain at least one hetero atom, and $R^5$ is hydrogen, a straight, branched or cyclic $C_1$-$C_{10}$ alkyl group or $C_6$-$C_{10}$ aryl group.

3. The material of claim 1, further comprising an organic solvent.

4. The material of claim 1, further comprising a crosslinker and an acid generator.

5. A patterning process comprising the steps of:
applying the undercoat-forming material of claim 1 onto a processable substrate to form an undercoat layer,
applying a photoresist composition onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus.

6. The patterning process of claim 5, wherein said photoresist composition comprises a silicon atom-containing polymer, and the processing step includes dry etching the undercoat layer through the photoresist layer as a mask with an oxygen-based etching gas.

7. A patterning process comprising the steps of:
applying the undercoat-forming material of claim 1 onto a processable substrate to form an undercoat layer,
applying a silicon atom-containing intermediate layer over the undercoat layer,
applying a photoresist composition onto the intermediate layer to form a photoresist layer,
exposing the photoresist layer in a predetermined region to radiation,
developing the photoresist layer with a developer to form a photoresist pattern, processing the intermediate layer through the patterned photoresist layer as a mask,
removing the patterned photoresist layer, and
processing the undercoat layer and then the substrate through the processed intermediate layer as a mask,
the processing steps using a dry etching apparatus.

8. The patterning process of claim 7, wherein said photoresist composition comprises a silicon atom-free polymer, and the step of processing the undercoat layer includes dry etching with an oxygen-based etching gas.

* * * * *